United States Patent
Begin et al.

[19]

[11] Patent Number: 5,830,272
[45] Date of Patent: Nov. 3, 1998

[54] SYSTEM FOR AND METHOD OF PROVIDING A CONTROLLED DEPOSITION ON WAFERS

[75] Inventors: Robert George Begin, Santa Barbara; Peter J. Clarke, Montecito, both of Calif.

[73] Assignee: Sputtered Films, Inc., Santa Barbara, Calif.

[21] Appl. No.: 554,459

[22] Filed: Nov. 7, 1995

[51] Int. Cl.⁶ ..................................................... B05C 13/00
[52] U.S. Cl. ................. 118/500; 118/52; 118/56; 118/319; 118/320; 118/620; 118/621; 118/719; 118/729; 414/935; 414/936; 414/937; 414/941; 414/217
[58] Field of Search ................................... 118/50, 52, 56, 118/319, 320, 500, 719, 729, 620, 621; 414/935, 936, 937, 941, 217; 204/298.01, 298.02, 298.15, 298.26, 298.27, 298.28

[56] References Cited

U.S. PATENT DOCUMENTS

| | | | |
|---|---|---|---|
| 4,747,928 | 5/1988 | Takahashi et al. | 118/500 |
| 5,051,054 | 9/1991 | Wagner et al. | 414/217 |
| 5,100,502 | 3/1992 | Murdoch et al. | 118/620 |
| 5,126,027 | 6/1992 | Kudo et al. | |
| 5,223,112 | 6/1993 | Tepman | 204/298.15 |
| 5,232,505 | 8/1993 | Novak et al. | 118/500 |
| 5,310,410 | 5/1994 | Begin et al. | |
| 5,334,257 | 8/1994 | Nishi et al. | 118/500 |
| 5,404,894 | 4/1995 | Shiraiwa | 118/500 |
| 5,439,547 | 8/1995 | Kumagai | 204/298.15 |
| 5,518,542 | 5/1996 | Matsukawa et al. | 414/936 |

FOREIGN PATENT DOCUMENTS

| | | |
|---|---|---|
| 3032940 | 3/1981 | Germany . |
| 6172996 | 6/1994 | Japan .................................. 118/500 |

OTHER PUBLICATIONS

Patent Abstract of Japan, JP 61 220352 A (Seiei Kosan KK), 30 Sep., 1986 *abstract*.
IBM Technical Disclosure Bulletin, vol. 21, No. 7 (Dec. 1978).

*Primary Examiner*—Laura Edwards
*Attorney, Agent, or Firm*—Ellsworth R. Roston; Fulwider Patton Lee & Utecht, LLP

[57] ABSTRACT

A robotic arm assembly in a transport module is expansible to have an effector at its end receive a substrate in a cassette module and is then contracted and rotated with the effector to have the effector face a process module. Planets on a turntable in the process module are rotatable on first parallel axes. The turntable is rotatable on a second axis parallel to the first axes to move successive planets to a position facing the effector. At this position, an alignment assembly is aligned with, but axially displaced from, one of the planets. This assembly is moved axially into coupled relationship with such planet and then rotated to a position aligning the substrate on the effector axially with such planet when the arm assembly is expanded. A lifter assembly aligned with, and initially displaced from, such planet is moved axially to lift the substrate from the effector. The arm assembly is then contracted, rotated with the effector and expanded to receive the next cassette module substrate. The lifter assembly is then moved axially to deposit the substrate on the planet. When the substrates have been deposited on the planets, the planets are individually rotated on the first axes by a stator rotatable on the second axis with the turntable. Guns having a particular disposition relative to the planets provide controlled depositions on the substrates during such planet rotations. The planets and the end effector hold the substrates at peripheral positions displaced from the controlled substrate depositions.

33 Claims, 28 Drawing Sheets

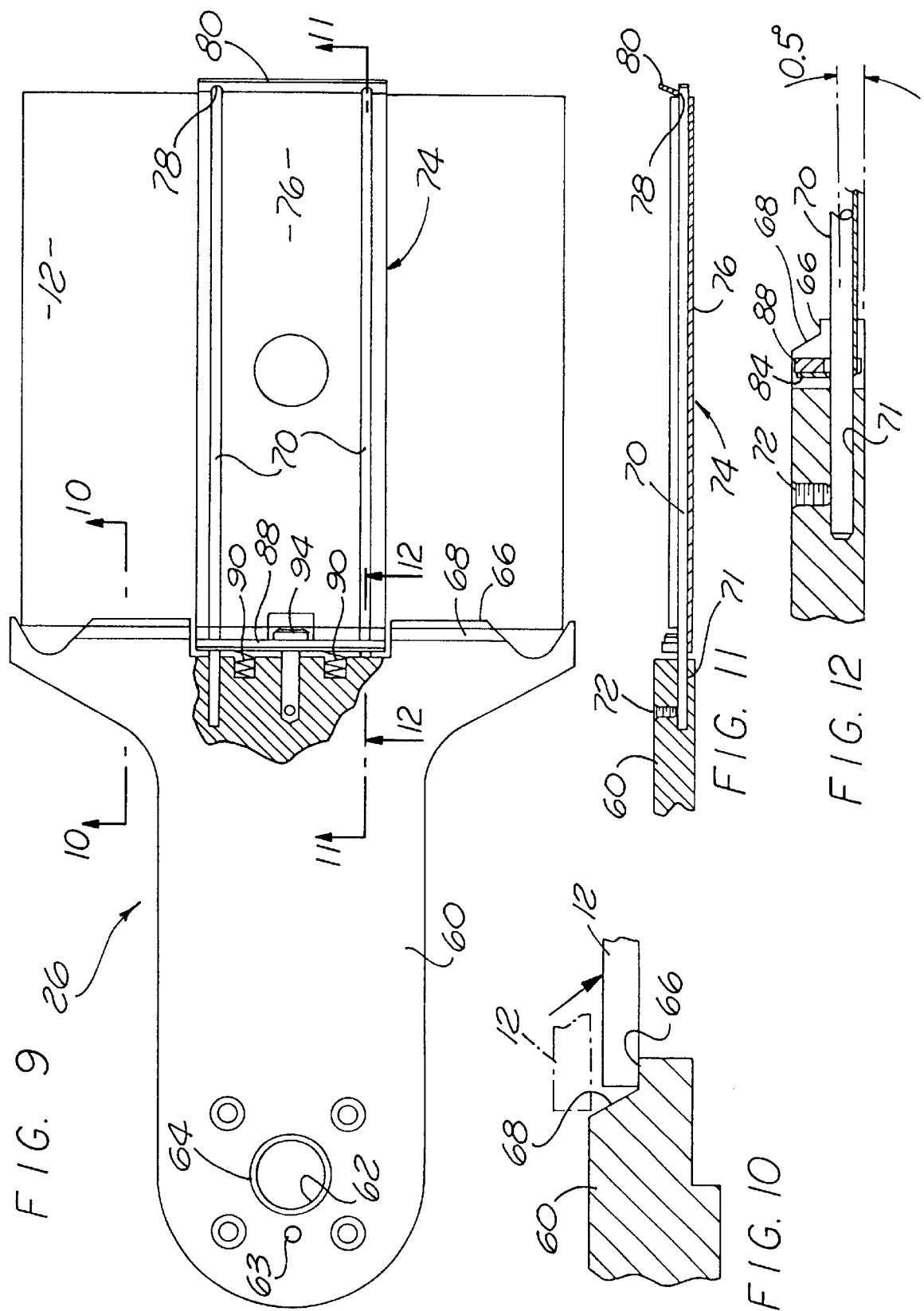

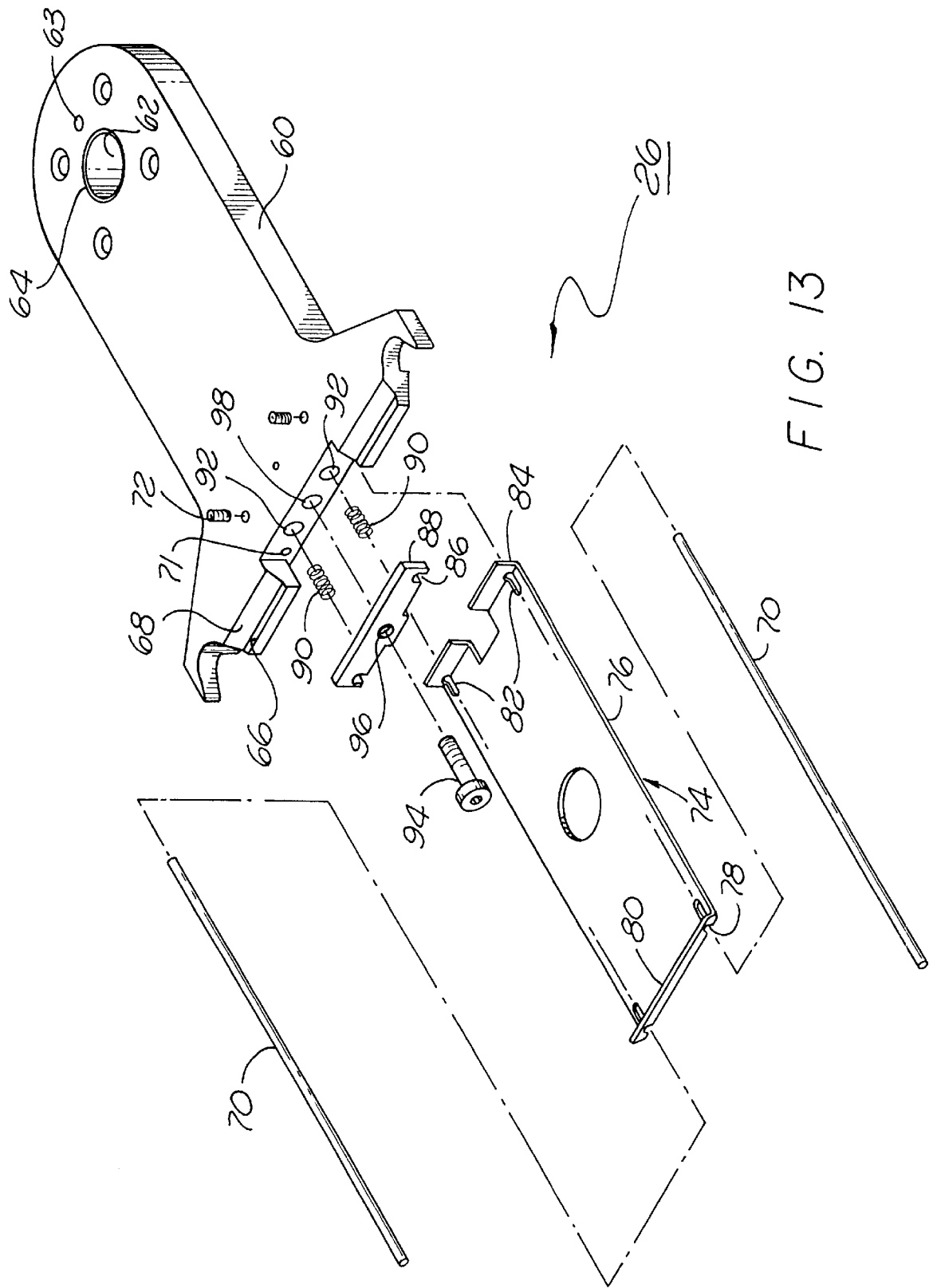

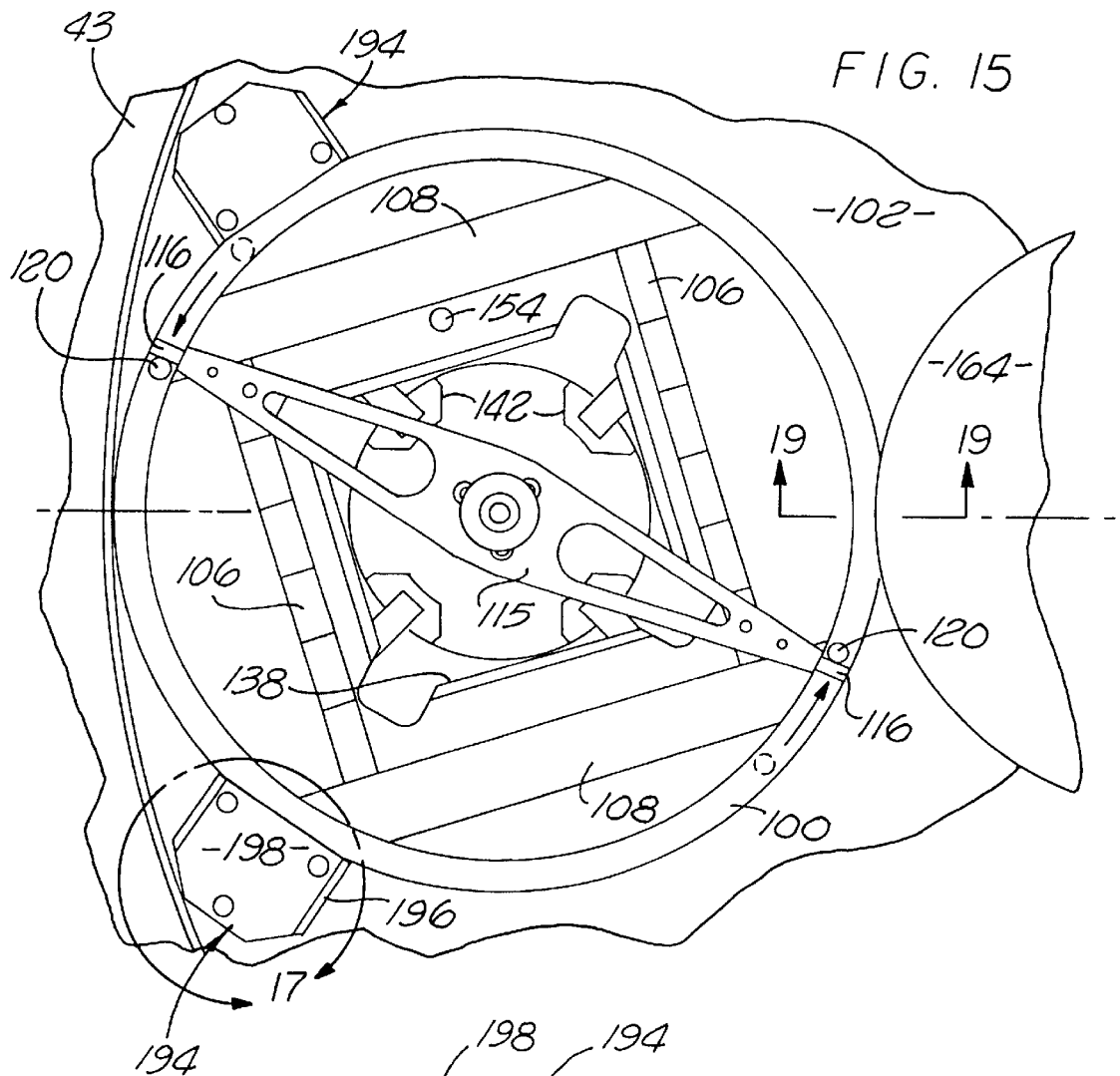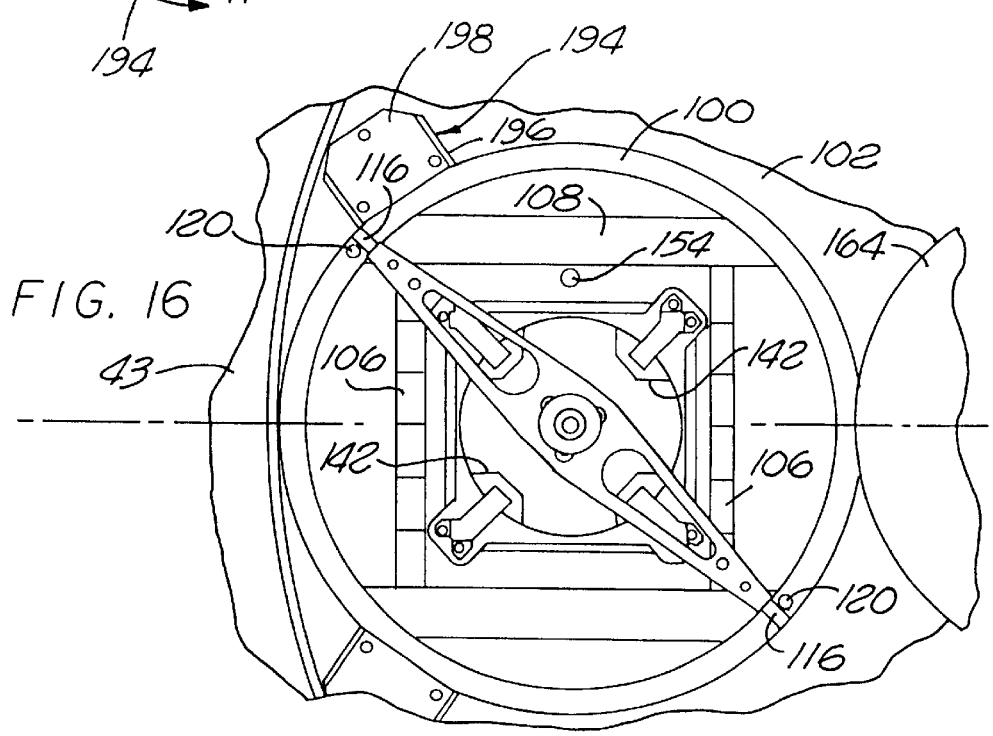

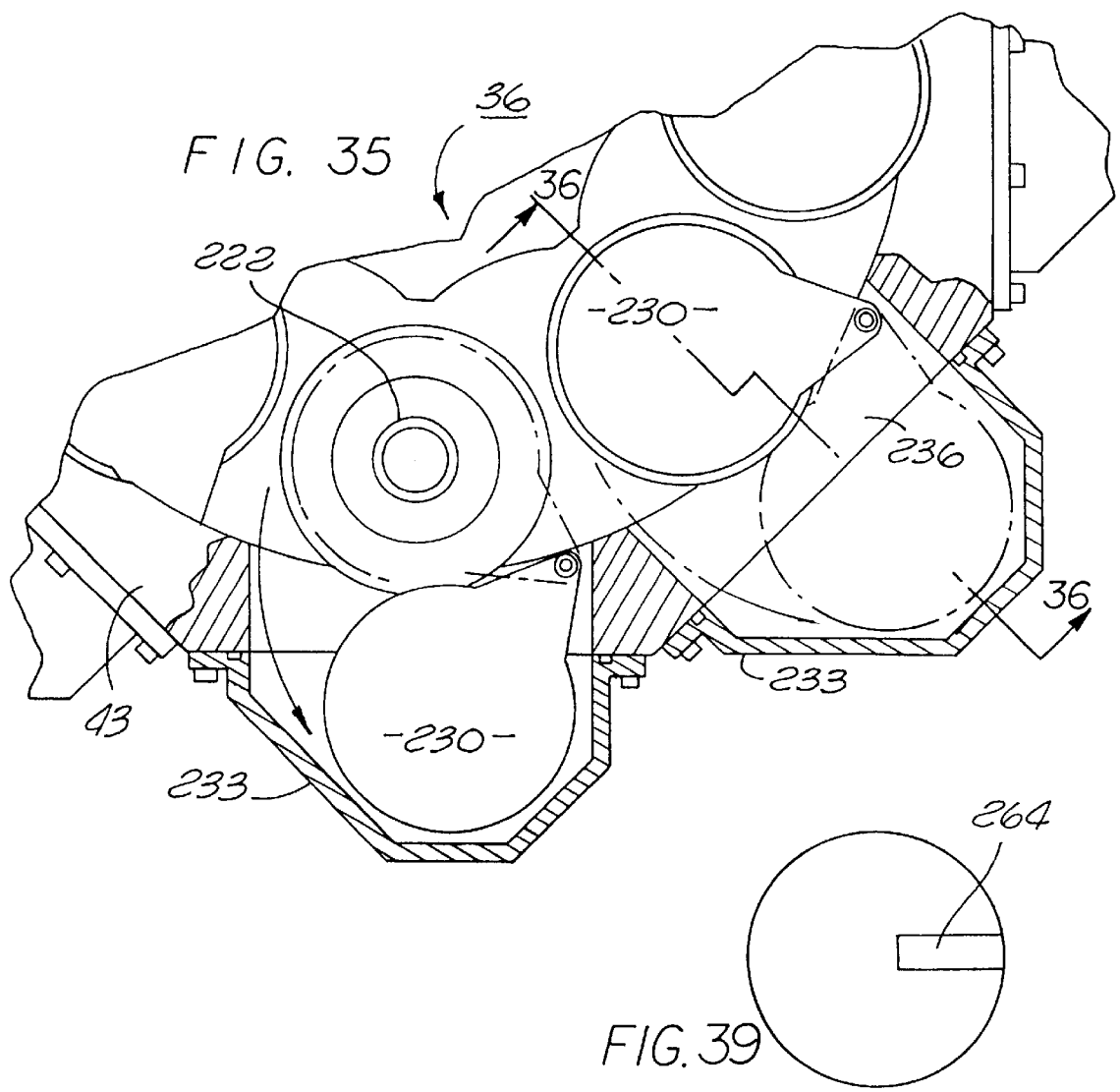
FIG. 35
FIG. 39
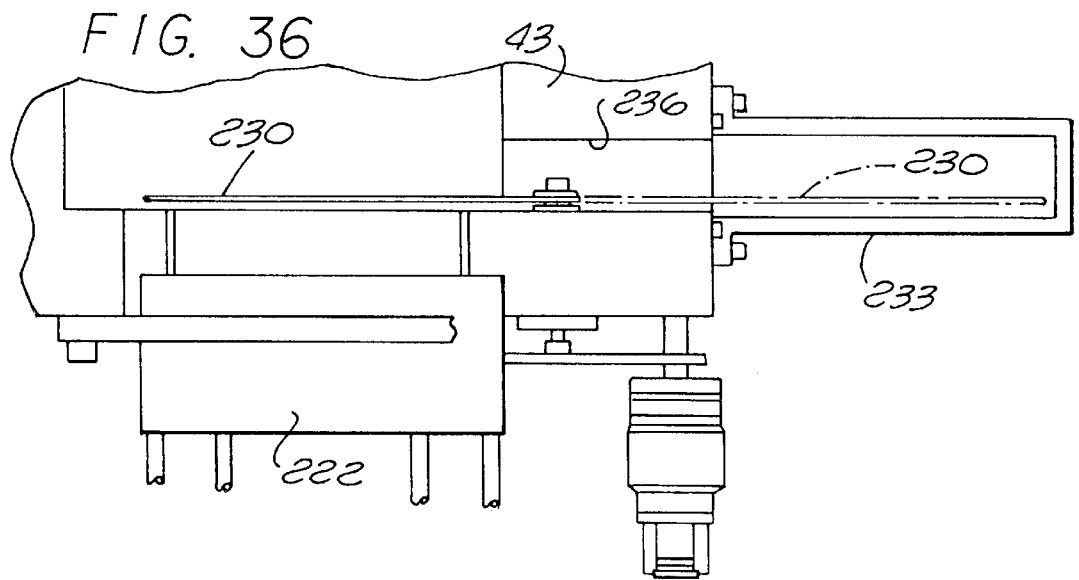
FIG. 36

SYSTEM FOR AND METHOD OF PROVIDING A CONTROLLED DEPOSITION ON WAFERS

This invention relates to apparatus for, and methods of, providing controlled depositions on substrates. The substrates are particularly adapted to provide die for use as the spacers in magnetic heads to dispose the magnetic heads in almost abutting relationship to a memory medium such as a disc and to protect the heads against damage by the disc if the disc should contact the heads while the disc is rotating at a high speed.

BACKGROUND OF THE INVENTION

Magnetic heads are provided in computers for transferring information between the magnetic heads and storage media such as discs disposed in contiguous (almost abutting) relationship to the heads. The magnetic media such as the discs are rotated by disc drives under the control of microcomputers to particular positions where the transfer takes place. When the transfer is from the disc drive to the magnetic head, the information read by the magnetic head is processed in the computer and the processed information is then transferred from the head to a storage position in the disc. The information transferred between the head and the disc is generally in binary form.

The rate of transferring binary information between the head and the storage medium such as the disc has been progressively increasing through the years. In order to transfer such information at progressively increasing rates, the size of the heads has been progressively decreased. Furthermore, as the size of the heads has progressively decreased, the precision in the manufacture of parts in the head has had to progressively increase in order to be able to transfer the binary information accurately between the head and the disc drive at the increased rates.

The magnetic heads include members which face the magnetic discs and protect the magnetic heads in case the magnetic discs should crash against the magnetic heads as the discs rotate at high speeds. These members may be made from a suitable insulating material such as an aluminum oxide with an index of refraction of at least 1.63 to provide the members with hard and dense characteristics. These members have decreased in size in accordance with the decrease in size of the heads. Furthermore, the dimensions of these members have had to become more precise as the size of these members has decreased and as the rates of transfer of the magnetic information between the heads and the discs have increased because of the rotation of the discs at increased speeds and because of the decreased size of these members. These members have been formed as die on a substrate.

Even as the size of the die on the substrate has tended to decrease through the years, the size of the substrate has tended to increase. As the size of the substrates has tended to increase, it has become progressively difficult to fabricate the members on the die with great precision. For example, when the substrate has a width of approximately six inches (6"), hundreds, if not thousands, of the members may be simultaneously produced on the substrate. Any slight deviation in dimension at one end of the substrate may become magnified in die which are progressively disposed on the substrate toward the other end of the substrate.

The substrates are often fabricated on a one-at-a-time basis in processing equipment. As will be appreciated, this fabrication is relatively slow even though there may be hundreds, if not thousands, of die on a single substrate. Processing equipment also exists for directing a plurality of substrates in sequence through a plurality of successive stations. Although this may be considered to constitute an improvement from a time standpoint, it still provides a processing of only a single substrate at any one time at each successive processing station.

It is desirable to process a plurality of substrates simultaneously to provide a deposition on each of the substrates with the same parameters. It is also desirable to process each of the substrates in the plurality simultaneously with great precision in each of the successive processing steps. This desirability of being able to process a plurality of substrates simultaneously with great precision has been recognized for some time but no one has been able to accomplish this until now. This has been particularly true in fabricating substrates each of which has hundreds, if not thousands, of die for use as members in magnetic heads.

It is further desirable to provide one (1) apparatus which operates on an automatic basis to process a plurality of substrates from the steps of receiving the substrates from a cassette module to the steps of positioning the substrates on planets and then to the steps of providing controlled depositions on planets. It is further desirable to provide apparatus which operates on an automatic basis to return the substrates to the cassette module after the controlled depositions on the substrates.

BRIEF DESCRIPTION OF THE INVENTION

This invention provides a system for, and method of, providing controlled depositions simultaneously on a plurality of substrates. The system and method of this invention also provide the controlled depositions simultaneously on the substrate with great precision. The system and method of this invention are also advantageous in that they are able to provide the controlled depositions simultaneously on the substrates, even when the substrates have square rather than round configurations, with great accuracy and at fast rates. The controlled depositions are able to be provided simultaneously on the substrates after precisely positioning the substrates so that the successive die are substantially parallel longitudinally and laterally to the walls defining the peripheries of the substrates.

In one embodiment of the invention, a robotic arm assembly in a transport module is expansible to have an effector at its end receive a substrate in a cassette module and is then contracted and rotated with the effector to have the effector face a process module. Planets on a turntable in the process module are rotatable on first parallel axes. The turntable is rotatable on a second axis parallel to the first axes to move successive planets to a position facing the effector. At this position, an alignment assembly is aligned with, but axially displaced from, one of the planets. This assembly is moved axially into coupled relationship with such planet and is rotated to a position aligning the substrate on the effector axially with such planet when the arm assembly is expanded.

A lifter assembly aligned with, and initially displaced from, such planet is moved axially to lift the substrate from the effector. The arm assembly is then contracted, rotated with the effector and expanded to receive the next cassette module substrate. The lifter assembly is then moved axially to deposit the substrate on the planet. When the substrates have been deposited on the planets as described above, the planets are individually rotated on the first axes by the turntable rotation on the second axis with the stator braked. Guns having a particular disposition relative to the planets provide controlled depositions on the substrates during such planet rotations. The planets and the effector hold the substrates at peripheral positions displaced from the controlled substrate depositions.

BRIEF DESCRIPTION OF THE DRAWINGS

In the drawings:

FIG. 9 is a top plan view of the end effector also shown in FIGS. 6A, 6B, 7, 8A, 8B and 8C and is partially broken away to show components in the end effector in section;

FIG. 10 is an enlarged fragmentary sectional view taken substantially on the line 10—10 in FIG. 9 and shows certain components in the end effector in additional detail;

FIG. 11 is an enlarged fragmentary sectional view of the end effector and is taken substantially on the line 11—11 of FIG. 9;

FIG. 12 is an enlarged fragmentary sectional view of the end effector and is taken substantially on the line 12—12 of FIG. 9;

FIG. 13 is an enlarged exploded perspective view of the end effector;

FIG. 15 is an enlarged fragmentary sectional view taken substantially on the line 15—15 of FIG. 14 and shows in plan the planet with no substrate on the planet, the planet being misaligned with the end effector although this is not specifically shown in FIG. 15;

FIG. 16 is an enlarged fragmentary sectional view similar to that shown in FIG. 15 and shows in plan the planet and the substrate on the planet, the planet being aligned with the end effector although this is not specifically shown in FIG. 16;

FIG. 22A is an enlarged fragmentary sectional view of the planet and a substrate on the planet and is taken within a circle designated as "A" in FIG. 22;

FIG. 35 is an enlarged fragmentary view similar to that shown in FIG. 32 and shows an alternate embodiment of shutters for covering the guns;

FIG. 36 is a sectional view taken substantially on the line 36—36 of FIG. 35 and shows additional details of one of the guns and the embodiment of the shutter mechanism shown in FIG. 35 for opening and closing the gun;

FIG. 39 is a schematic diagram of an arrangement for improving the uniformity of the controlled deposition on the substrates.

Figure 1:
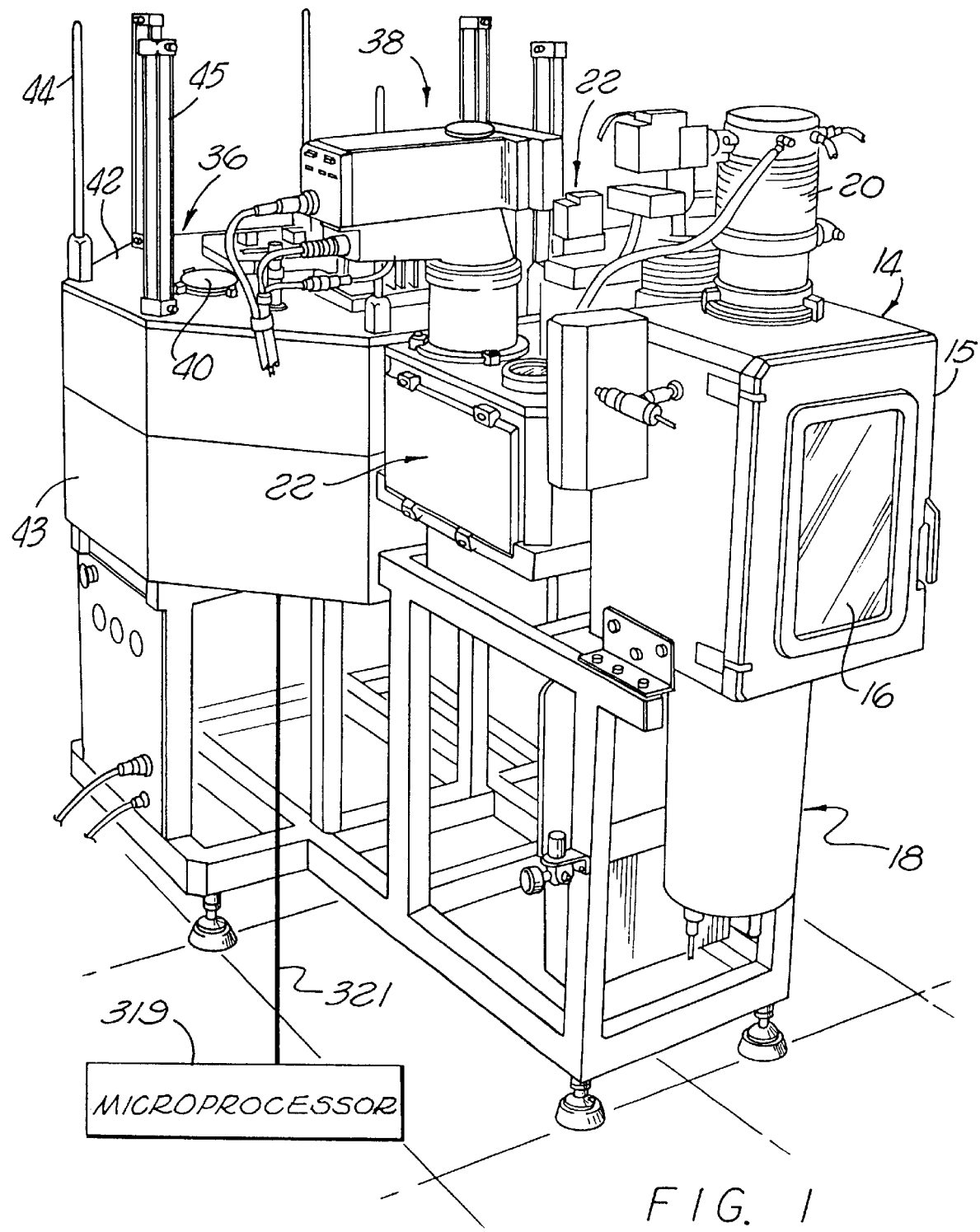
FIG. 1 is a schematic perspective view of apparatus constituting one embodiment of the invention for simultaneously producing a controlled deposition on a plurality of substrates, the apparatus being seen from a cassette module above and at one end of the apparatus.

In one embodiment of the invention, apparatus generally indicated at 10 (FIG. 1) is provided for producing controlled depositions on substrates 12 (FIGS. 6, 7, 8A, 8B and 8C). The substrates 12 may include a plurality of dies each of which may be disposed on a magnetic head in juxtaposition to a movable member such as a memory disc rotatable at a very high speed. The dies may be coated with a layer of a suitable material such as aluminum oxide ($Al_2O_3$) having an index of refraction such as at least 1.63 to provide the die with a hard and dense surface. In this way, the die protects the head from being damaged if and when the memory disc should wobble and contact the head while the memory disc is rotating at a high speed. The head provides a transducing action in magnetically reading digital information stored in the disc or in magnetically writing magnetic information on the disc.

The apparatus 10 includes a cassette module, generally indicated at 14, for storing a plurality of the substrates 12 in a stacked relationship. The cassette module 14 includes a load lock 15 and a door 16 which is normally closed and which is opened to store the substrates 12 in the cassette module. The cassette module 14 also includes an elevator generally indicated at 18 (FIGS. 3 and 7) for raising or lowering the cassette in the cassette module. Vacuum pumps 20 may be disposed on the cassette module 14 to produce a vacuum in the cassette module after the substrates 12 have been disposed in the cassette module. The construction of the cassette module 14, the load lock 15, the elevator 18, and the vacuum pumps 20 are known in the prior art.

Figure 6:
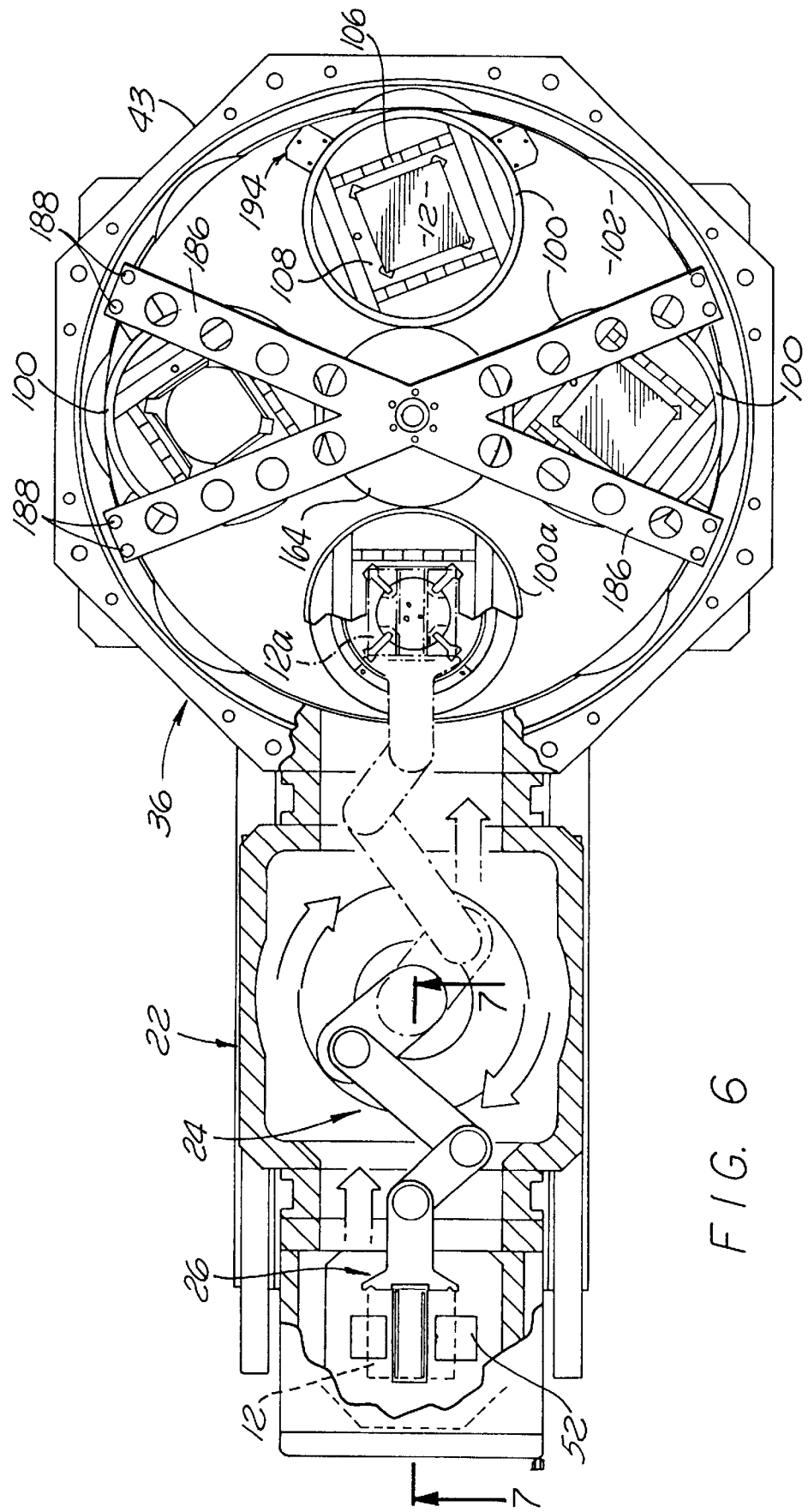
FIG. 6 is a sectional view taken substantially on the line 6—6 of FIG. 3 and illustrates in additional detail the construction of the cassette module, the transport module and the process module and the construction of a robotic arm assembly and an end effector in the transport module, the robotic arm assembly being shown in one position in solid lines and in another position in broken lines.
Figure 6A:
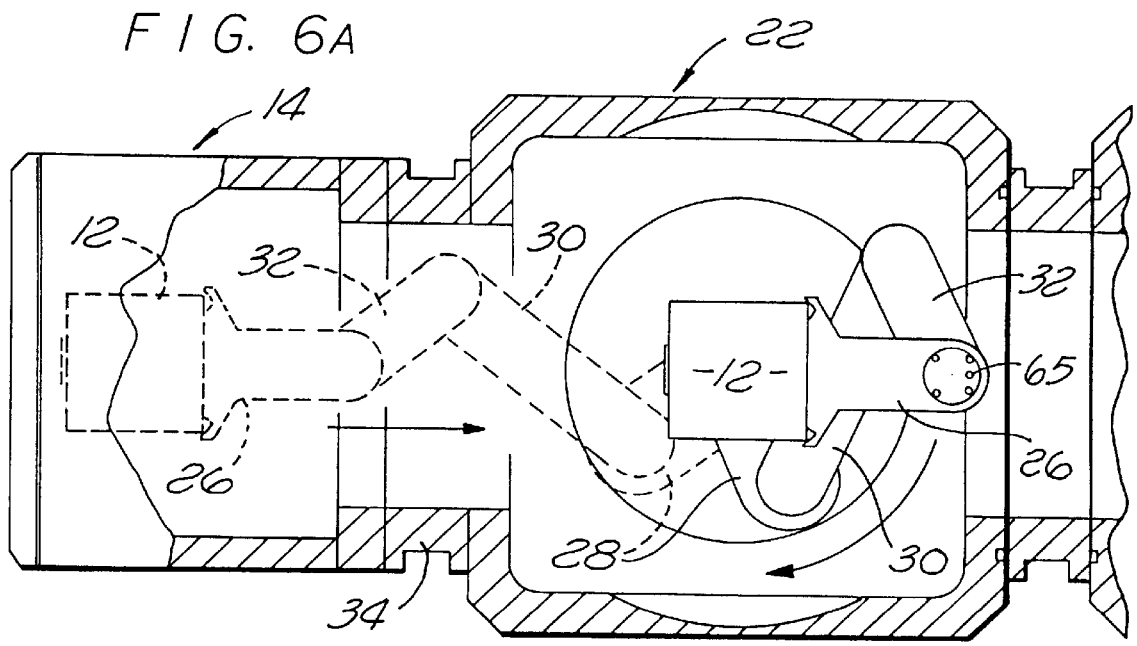
FIG. 6A is a fragmentary top plan view of the cassette module and the transport module and shows, in broken lines, the robotic arm assembly and the end effector in an expanded relationship with the end effector in the cassette module and shows, in solid lines, the robotic arm assembly and the end effector in a contracted relationship with the end effector in the transport module.
Figure 6B:
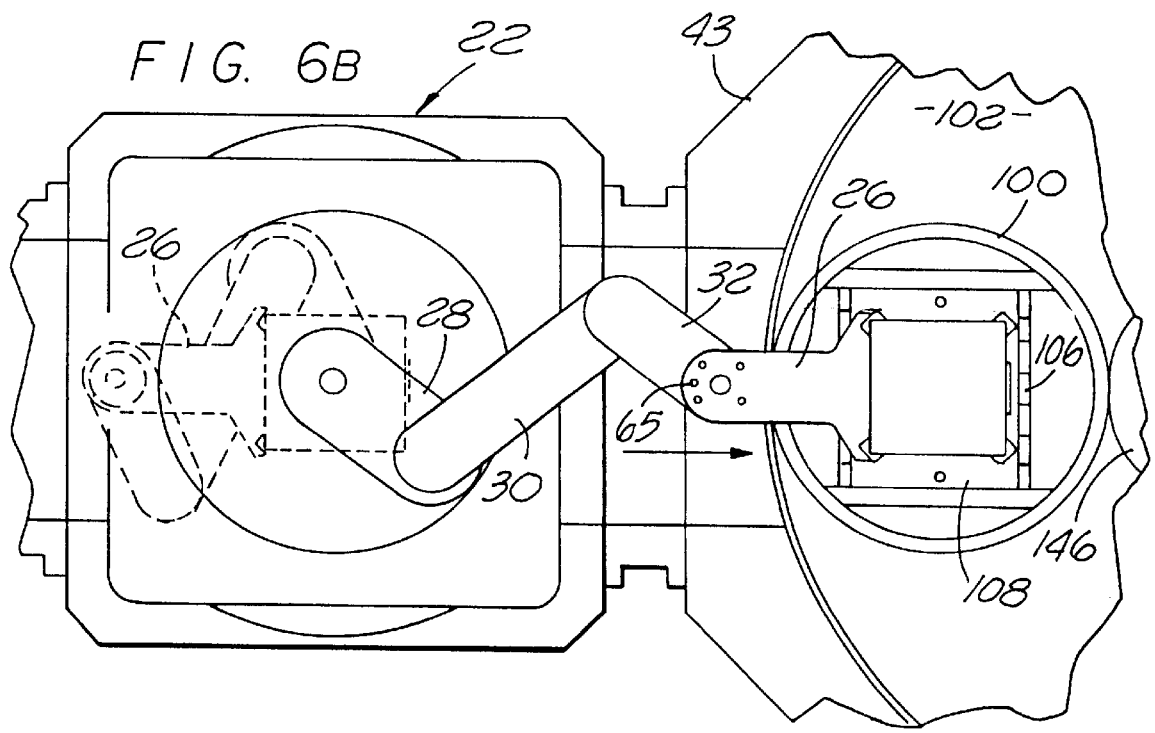
FIG. 6B is a fragmentary top plan view of the transport module and the process module and shows, in broken lines, the end effector in the transport module and, in solid lines, the end effector in the process module.
Figure 7:
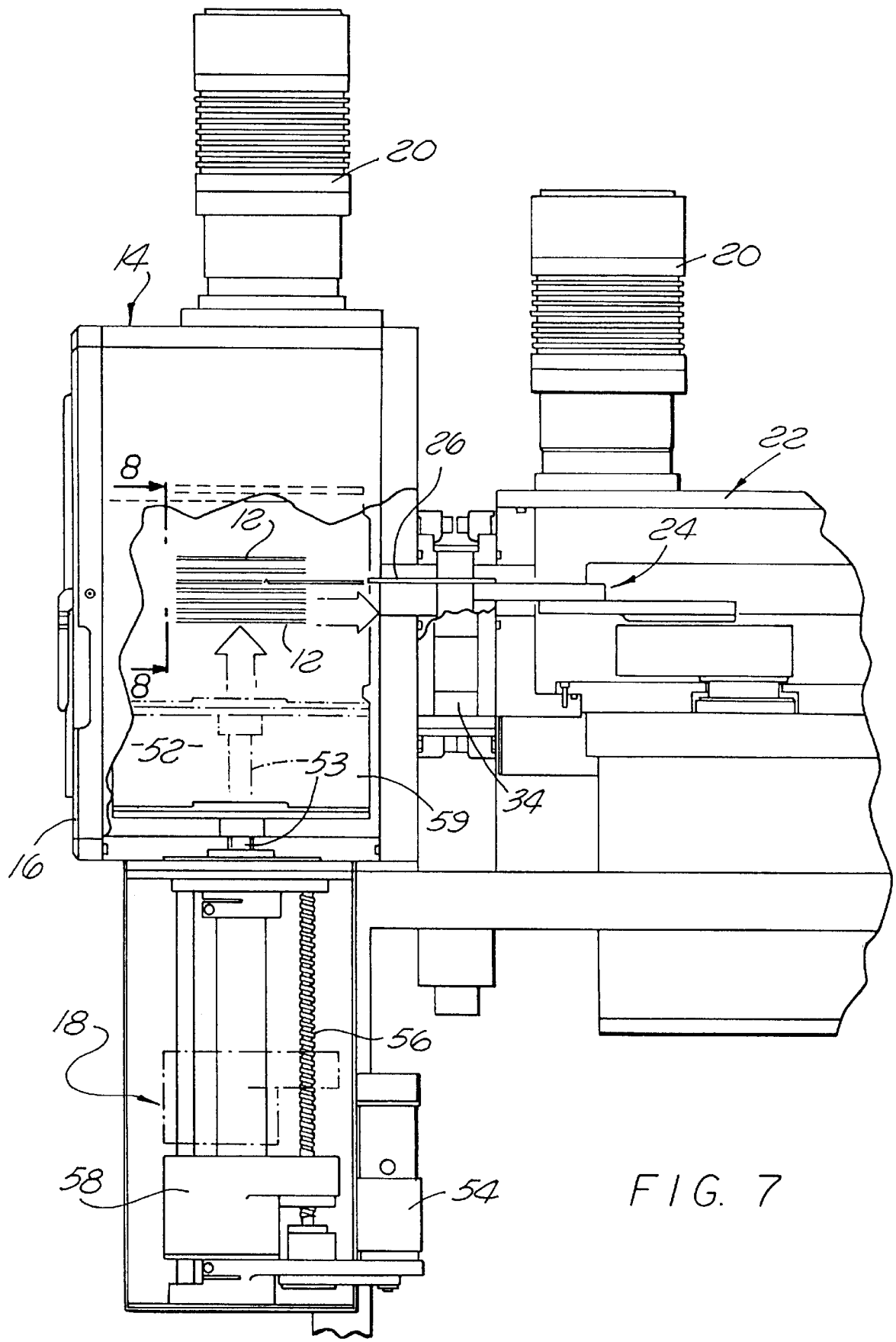
FIG. 7 is a side elevational view, partially in section, schematically showing in additional detail the construction of the cassette module and the transport module.

The apparatus 10 also includes a transport module generally indicated at 22. The transport module includes a robotic arm assembly generally indicated at 24 (FIGS. 6 and 7). The transport module 22 and the robotic arm assembly 24 may be considered to be known in the art although an end effector, generally indicated at 26 in FIG. 6, at the end of the robotic arm assembly is not known in the prior art. The robotic arm assembly includes arms 28, 30 and 32 (FIGS. 6A and 6B) pivotable relative to one another between an expanded relationship shown in broken lines in FIG. 6A and a contracted relationship shown in solid lines in FIG. 6A and between a contracted relationship shown in broken lines in FIG. 6B and shown in solid lines in FIG. 6B in an expanded relationship. The end effector 26 is disposed at the end of the arm 32 and is constructed to hold one of the substrates 12.

In one expanded position, the robotic arm assembly 24 extends through a slot valve 34 (FIGS. 4 and 6A) into the cassette module 14 to grip one of the substrates 12 in the cassette module. This is shown in broken lines in FIG. 6A. The robotic arm assembly 24 is then contracted to withdraw the end effector 26 through the slot valve 34 into the transport module 24. This is shown in broken lines in FIG. 6B. When this occurs, the cassette module 14 and the transport module 22 are preferably at a vacuum pressure. The transport module 22 also includes a cryogenic unit, generally indicated at 38 (FIGS. 1 and 4), for eliminating water molecules in the transport module.

With the robotic arm assembly 24 contracted in the transport module 22, the robotic arm assembly and the end effector 26 are rotated through an angle of substantially 180° so that the end effector faces a process module generally indicated at 36. The positions of the robotic arm assembly 24 and the end effector 26 at this time are shown in broken lines in FIG. 6B. The robotic arm assembly 24 may then be expanded to move the end effector 26 and the substrate 12 on the end effector into the process module 36. The position of the end effector 26 at this time is shown in solid lines in FIG. 6B.

The construction of the process module 36 is considered to be unique. The process module 36 processes the substrates 12 transferred into the process module to provide the controlled depositions on the substrates. An access cover 40 is included in the process module 36 for providing access by a user into the process module.

A cover 42 (FIG. 2) is disposed on a housing 43 of the process module 36. The cover 42 is movable upwardly and downwardly on guide rods 44 by cylinders 45 to expose or cover the members or units inside the process module. A shield 46 having apertures 48 is disposed on the cover 42. The shield 46 is disposed over a heater assembly, generally indicated at 50, to protect the heater assembly and to provide for the evacuation of hot air from the heater assembly and for the introduction of cooling air into the heating assembly.

As shown in FIG. 7, the cassette module 14 includes a cassette, generally indicated at 52, for holding a plurality of the substrates 12 in a stacked relationship. The cassette 52 is movable upwardly and downwardly by a motor 54 which rotates a lead screw 56. A nut 58 is movable vertically on the lead screw 56 as the lead screw rotates. The nut 58 in turn carries the cassette 52 vertically through a shaft 53.

Figure 8A:
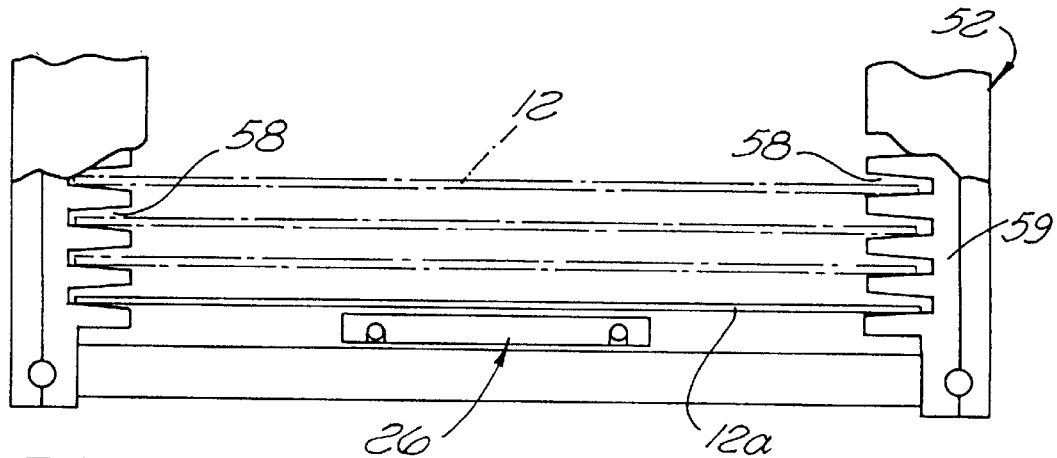
FIG. 8A is an enlarged fragmentary sectional view taken substantially on the line 8—8 of FIG. 7 and shows the disposition of a substrate cassette in the cassette module and also shows the end effector in the cassette module before the disposition of one of the substrates in the cassette on the end effector.
Figure 8B:
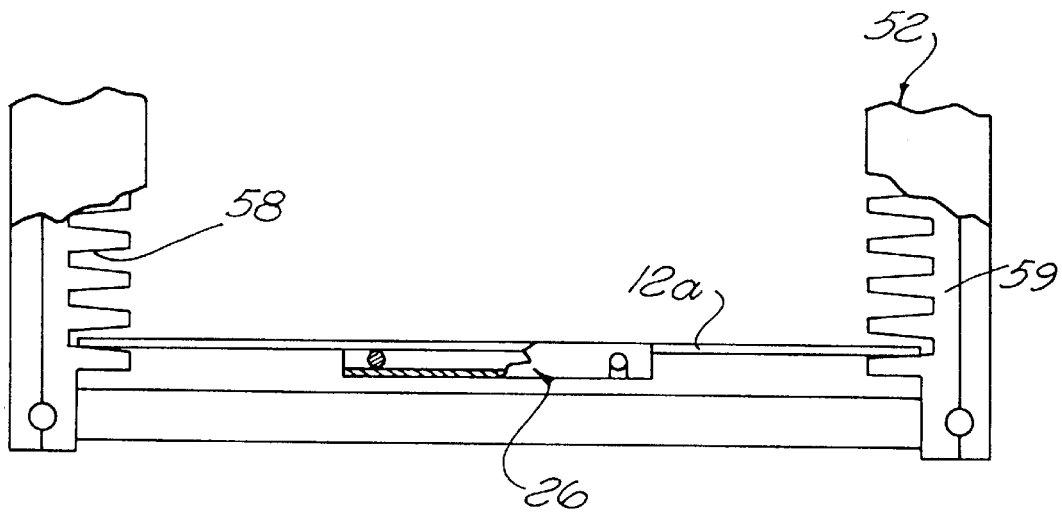
FIG. 8B is a view similar to that shown in FIG. 8A but shows the cassette lowered in position so that one of the substrates rests on the end effector.
Figure 8C:
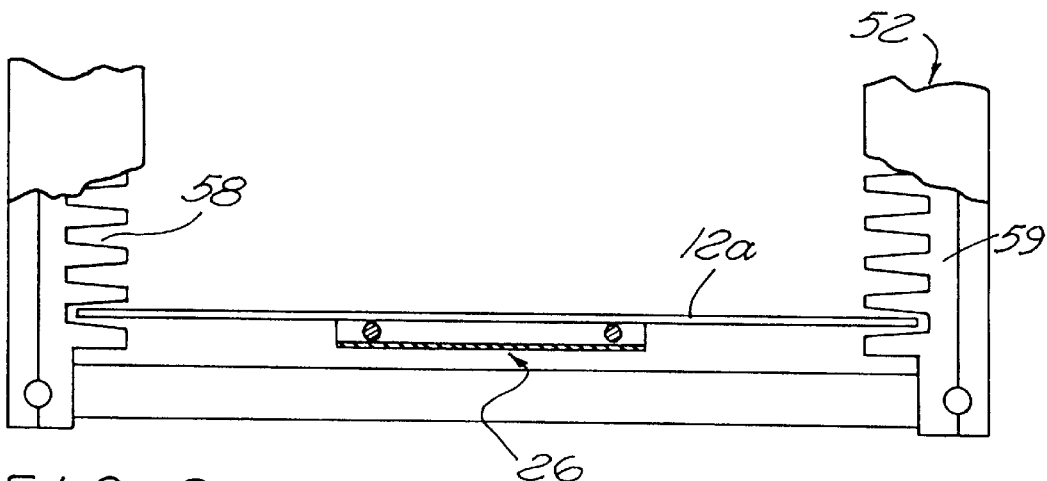
FIG. 8C is a view similar to that shown in FIGS. 8A and 8B but shows the cassette module lowered further to space the substrate on the end effector from the wall defining the socket in which such substrate is seated, thereby freeing such substrate for movement from the cassette.

FIGS. 8A, 8B and 8C schematically show how the substrates 12 are individually transferred from the cassette 52 to the end effector 26. As may be seen in FIG. 8A, the substrates 12 are disposed in a vertically spaced and stacked relationship in notches 58 in a wall 59 of the cassette 52. In FIG. 8A, the end effector 26 is disposed below, and in vertically spaced relationship to, the bottom one 12a of the substrates 12 in the cassette 52. FIG. 8B shows the cassette 52 in a lowered position relative to that shown in FIG. 8A such that the end effector 26 abuts the bottom surface of the substrate 12a in the cassette 52.

When the cassette 52 is lowered even further as shown in FIG. 8C, the substrate 12a is disposed in its notch 58 so that it does not contact any of the walls defining the notch. Since the end effector 26 is still contacting the substrate 12a at this time, the end effector is able to remove the substrate easily from the notch 58 when the robotic arm assembly is moved from the expanded relationship shown in broken lines in FIG. 6A to the contracted relationship shown in solid lines in FIG. 6A. The results described for removing substrates 12 from the cassette 52 can also be achieved by raising and lowering the robotic arm assembly 24. Such raising and lowering of the robotic arm assembly 24 are considered to be within the scope of this invention.

The construction of the end effector 26 is shown in detail in FIGS. 9–13. The end effector 26 includes a body 60 which is provided with a vent hole 62 (FIG. 9) chamfered as at 64. A hole is provided to register the end effector 26 on a dowel 65 (FIG. 6A) in the arm 32. The body 60 is provided with a horizontal ledge 66 (FIG. 10) to receive the substrate 12 and with a bevelled surface 68 extending upwardly at an acute angle from the inner end of the ledge 66. The ledge 66 and the bevelled surface 68 accurately position one end of the substrate 12 as schematically shown in FIG. 10.

A pair of spaced rods 70 extend at one end into holes 71 (FIG. 11) in the body 60. The rods 70 are fixedly positioned at that end relative to the body 60 as by set screws 72 extending into the body. The rods 70 may be disposed at a suitable angle such as approximately five degrees (5°) to the horizontal to accommodate any deflection resulting from variations in weight between different substrates.

A web, generally indicated at 74, having a bottom panel 76 is impaled on the rods 70 by extending the rods at one end through holes 78 (FIG. 13) in a flange 80 which extends upwardly from the bottom panel in a transverse relationship (preferably at approximately an 80° angle) to the bottom panel 76. The web 74 is also impaled by extending the rods 70 through holes 86 in a clamping plate 88 and through holes 82 in a flange 84 at the other end of the bottom panel 76. The flange 84 is substantially perpendicular to the bottom panel 76.

The rods 70 then extend from the flange 84 into the holes 71 in the body 60. The clamping plate 88 is biased outwardly from the rods 70 against the flange 84 by helical springs 90 which extend in a constrained relationship from holes 92 in the body 60 against the flange 84. A screw 94 extends through a hole 96 in the clamping plate 88 into a hole 98 in the body 60. The screw 94 is adjustable in the hole 98 to adjust the bias exerted by the helical springs 90 against the flange 84 and the clamping plate 88.

The end effector 26 provides a balanced arrangement which contacts the substrate 12 only at positions at the opposite ends of the substrate where depositions are not provided on the substrate. As a result, the end effector 26 lifts the substrate 12a from the cassette 52 and transfers the substrate through the transport module 22 to the process module 36 without scratching the surface of the substrate in the working area where the controlled deposition is to be provided on the substrate. The substrate 12 is engaged on the end effector 26 by being disposed at one end on the ledge 66 (FIG. 10) and by being disposed at the other end against the flange 80.

The end effector 26 is balanced by adjusting the positioning of the screw 94 in the hole 98 in the body 60 to produce adjustments in the forces exerted by the springs 90 against the flange 84 and the clamping plate 88. The springs 92 then act to balance the forces at the opposite ends of the flange 84 and the clamping plate 88 so that the forces are distributed across the width of the end effector 26. The rods 70 contact the substrate 12 at the position where the rods extend through the holes 78 (FIG. 13) in the flange 80. The rods 70 serve primarily as backbones to support and position the web 74 relative to the body 60.

Figure 27:
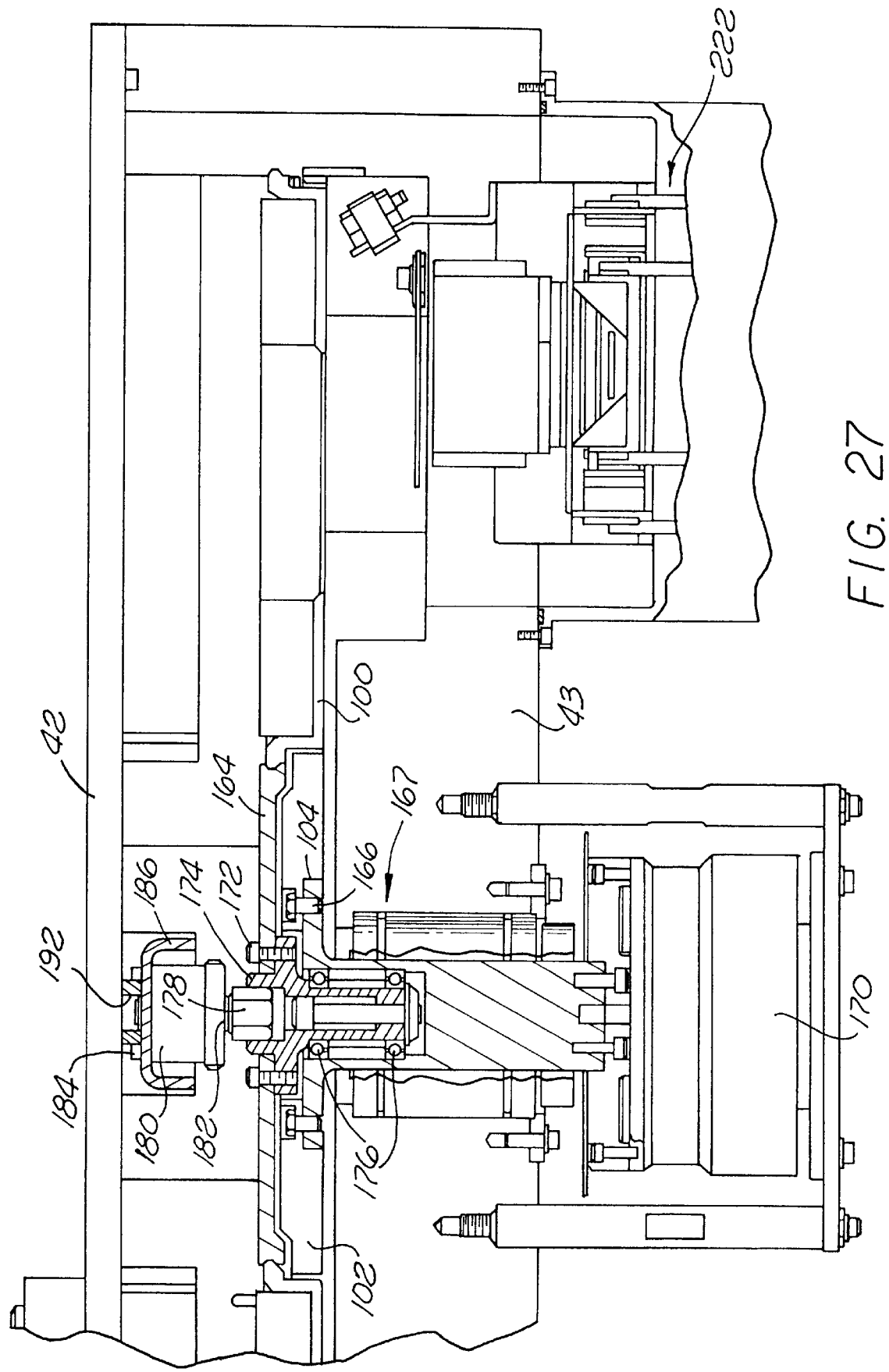
FIG. 27 is a sectional view taken substantially on the lines 27—27 of FIG. 4 and shows the turntable, the stator and one of the planets and also shows the gun for producing the controlled deposition on the substrate and a shutter in position relative to the gun and the planet for preventing the gun from producing the deposition on the substrate.

The substrates 12 are preferably square. They are deposited on planets 100 (FIG. 14) in the process module 36 so that they have a precise disposition on the planets. As will be seen in FIGS. 5 and 6, there are preferably four (4) planets 100 in the process module 36. Each planet is disposed on a turntable 102 to be rotatable with the turntable on a hub 104 (FIG. 27). The centers of the planets 100 are spaced the same radial distance from the center of the hub 104. The planets 100 are angularly spaced from one another by angles of substantially 90° relative to the hub 104.

Each of the planets 100 includes permanent magnets 106 (FIGS. 15 and 16) disposed at opposite ends of the planet and also includes magnetic pole pieces 108 which define substantially a rectangular enclosure providing a closed loop for the creation of a magnetic field. The construction and disposition of the permanent magnets 106 and the pole pieces 108 in apparatus for providing controlled depositions on the substrate 12 are well known in the art.

The turntable 102 is rotated on the hub 104 to dispose each of the planets 100 in position to receive one of the substrates 12 from the end effector 26. For example, the planet 100 is in position in FIG. 6 to receive the substrate 12a (FIGS. 8A, 8B and 8C) on the end effector 26. When the turntable 102 has rotated the planet 100a to the position for receiving the substrate 12a, as shown in FIG. 6, an alignment assembly generally indicated at 110 in FIG. 14 becomes operative to rotate the planet 100a on the axis of the planet to position the planet to receive the substrate 12a.

The alignment assembly 110 is positioned on the same axis as the planet 100a. The alignment assembly 110 includes pneumatic cylinders 112 which operate in conjunction with a bellows 114 to move the alignment assembly vertically along the axis of the alignment assembly. The alignment assembly 110 includes a drive arm 115 which extends radially across the alignment assembly at the lower end of the alignment assembly and which has drive pins 116 at the radially outward end of the drive arm.

Figure 2:
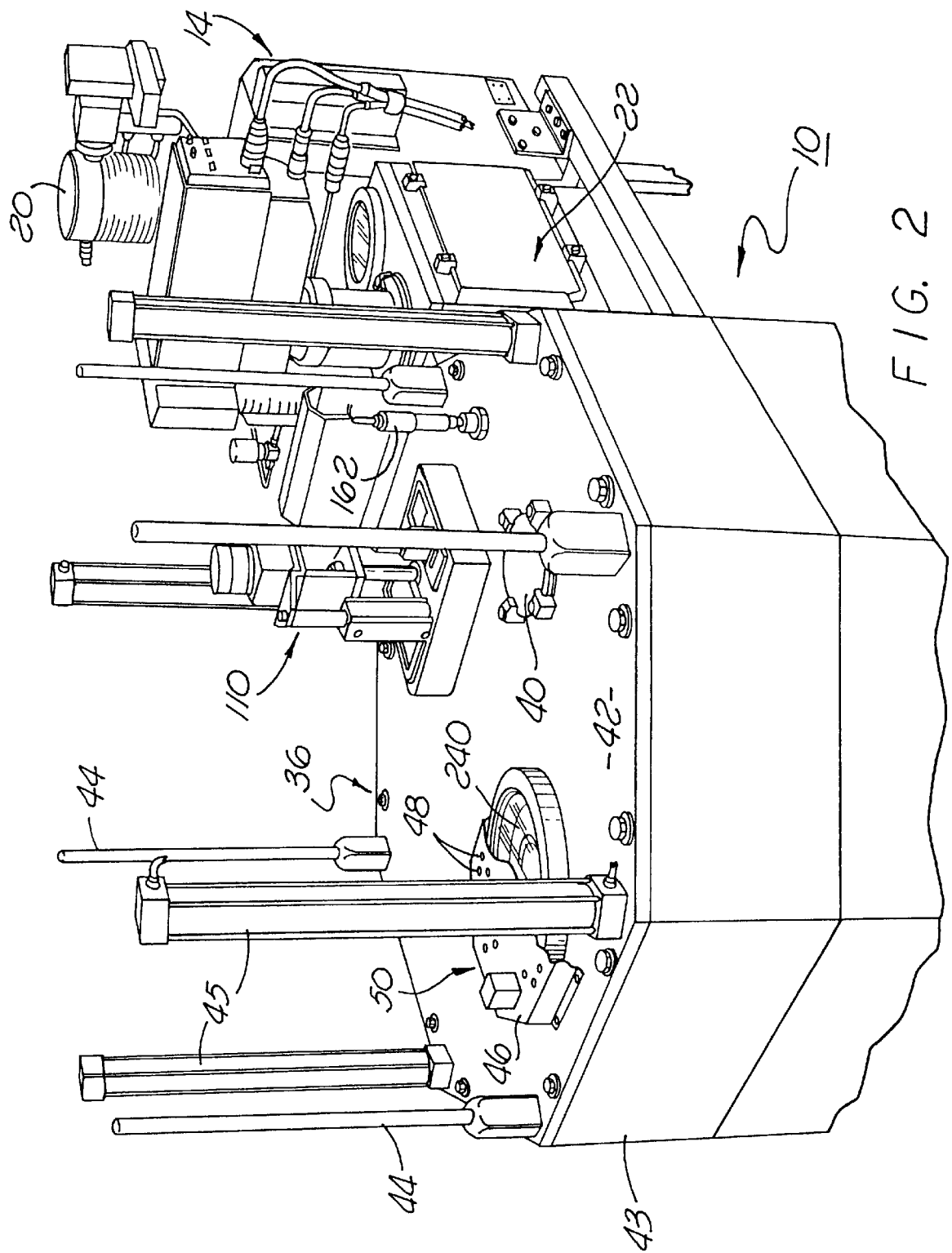
FIG. 2 is a schematic perspective view of the apparatus shown in FIG. 1 as seen from a process module at the other end of the apparatus.
Figure 23:
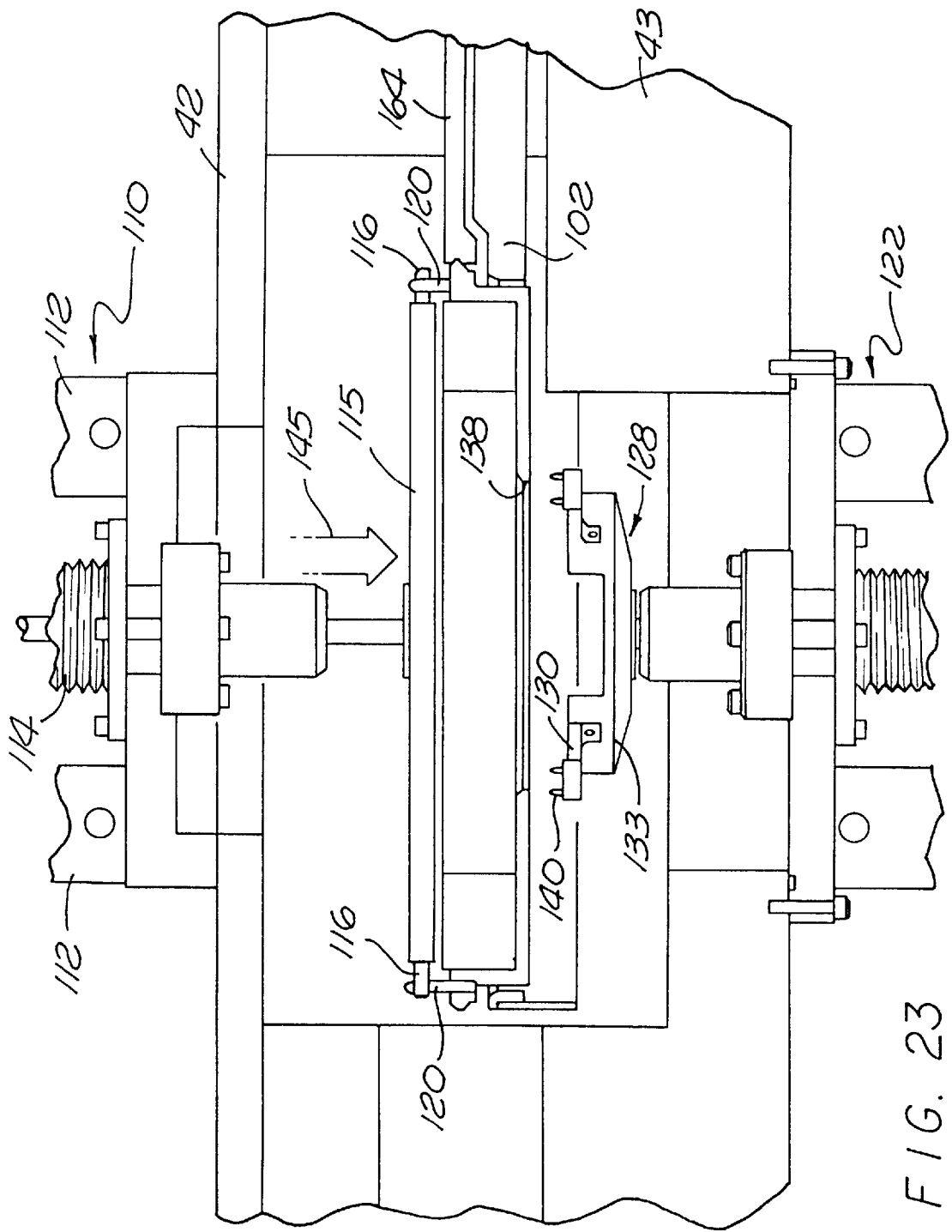
FIG. 23 is a simplified schematic side elevational view similar to that shown in FIG. 14 and shows the relative dispositions of the alignment assembly, the planet and the lifter assembly after the movement of the alignment assembly downwardly into coupled relationship with the planet to rotate the planet to a particular position.

When the alignment assembly 110 has been lowered to substantially the vertical level of the planet 100 as shown in FIG. 23, the alignment assembly is incrementally rotated by a motor 118 (FIG. 14), at the upper end of the alignment assembly. The calibrated position may be sensed and controlled by a sensor assembly 50 as shown in FIG. 2. The rotation of the motor 118 causes the drive pin 116 on the alignment assembly 110 to engage a pin 120 at the top of the planet 100 and to rotate the planet to a particular rotary position for receiving the substrate. The motor 118 may be a stepper motor which is computer controlled to provide a precise control over the positioning of the pin 116.

The operation of the motor 118 is then discontinued and the alignment assembly 110 is withdrawn axially upwardly from the planet 100 by the operation of the pneumatic cylinders 112 and the bellows 114. The robotic arm assembly 24 is facing the process module 36 at this time as shown in FIG. 6B. The robotic arm assembly 24 is then expanded into the process module 36 (shown in solid lines in FIG. 6) to move the effector assembly 26 to a position above the planet so that the substrate on the end effector can be subsequently transferred to the planet. This is indicated by an arrow 121 in FIG. 24.

A lifter assembly generally indicated at 122 is disposed in the process module 36. The lifter assembly 122 is disposed below the planet 100a in axial alignment with, and axial displacement from, the planet 100a. The lifter assembly 122 is also disposed in axial alignment with the alignment assembly 110. The lifter assembly 122 is adapted to lift the substrate 12a from the end effector 26 and to deposit the substrate on the planet 100a. This is accomplished after the alignment assembly 110 has rotated the planet 100a to the position for receiving the substrate from the end effector 26.

The lifter assembly 122 includes pneumatic cylinders 124 (FIG. 14) and a bellows 126 corresponding to the pneumatic cylinders 112 and the bellows 114 in the alignment assembly 110. The lifter assembly 122 also includes a lifter, generally indicated at 128, at the upper end of the lifter assembly. A motor 129, preferably a stepper motor, is computer controlled to rotate the lifter 128 to the precise position for receiving the substrate on the end effector. The incremental rotations of the stepper motor 129 are sensed by a sensor 131 which defines a homing position to which the lifter 128 has to be rotated to receive the substrate on the end effector.

Figure 21:
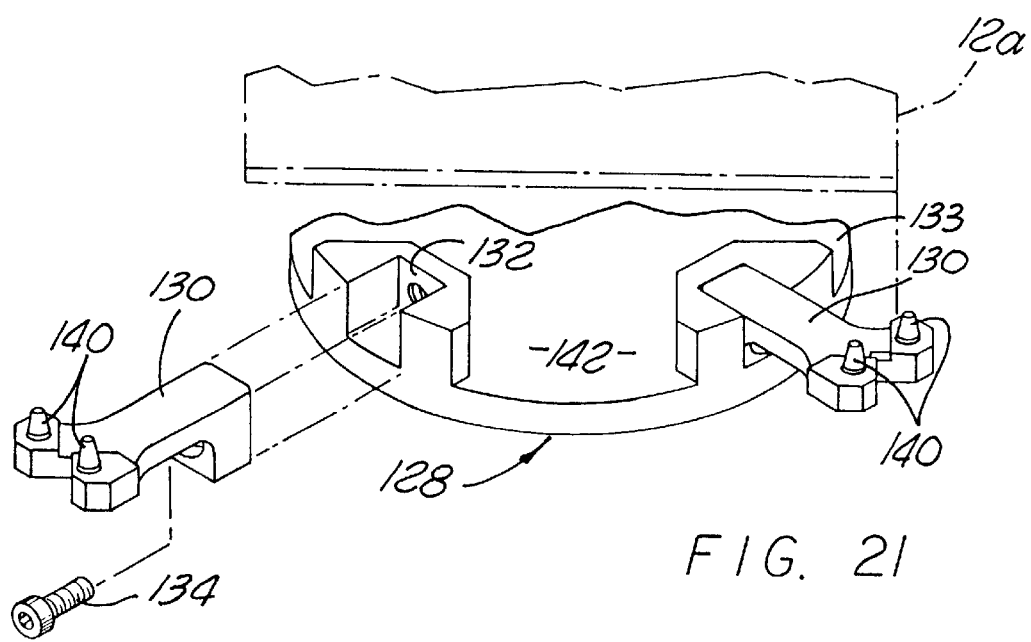
FIG. 21 is a fragmentary perspective view of a lifter in the lifter assembly and is partially exploded in one position to show the lifter in additional detail.

As best shown in FIG. 21, the lifter 128 includes a plurality of support arms 130 disposed around the periphery of the lifter at positions angularly spaced 90° from one another. The support arms 130 are disposed in sockets 132 in the lifter 128 and are attached to a lifter body 133 as by screws 134. The lifter assembly 122 is moved upwardly (as indicated by an arrow 135 in (FIG. 24) by the pneumatic cylinders 124 so that the lifter 128 passes through an opening 138 in the planet 100 to a position (FIG. 24) below and abutting the substrate 12a on the end effector 26.

Each of the support arms 130 on the lifter 128 has a pair of pins 140. As will be seen in FIG. 20, the pins 140 on each support arm 130 straddle one corner of the substrate 12a disposed on the end effector 26 when the lifter 128 is moved upwardly to the position shown in FIG. 24. The straddling relationship between the pins 140 and the corners of the substrate 12a causes the pins 140 to abut the corners of the substrate 12a when the lifter 130 is moved upwardly to lift the substrate from the end effector 26.

The pins 140 have tapered configurations as shown in FIG. 21. Because of this, the substrate 12a becomes adjusted in position as the substrate settles downwardly on the support arms 130. As the substrate 12a settles downwardly on the support arms 130 between the pins 140, the precision of the disposition of the substrate on the support arms becomes enhanced. Thus, when this downward movement has been completed, the substrate 12a is precisely abutted against a pair of the pins 140 at every corner of the substrate.

After the lifter 128 has lifted the substrate 12a from the end effector 26, the robotic arm assembly 24 is contracted so that the end effector 26 is withdrawn from the axis of the planet 100 and the lifter assembly 122. The withdrawal of the end effector 26 from the axis of the planet 100 is indicated by an arrow 141 in FIG. 24. The end effector 26 can be withdrawn at this time because the lifter assembly 122 has been raised to a position where the end effector 26 is disposed in notches 142 (FIG. 21) cut from the upper surface of the lifter body 133.

After the end effector 26 has been withdrawn from the axis of the lifter 128, the lifter assembly 122 is moved downwardly to deposit the substrate 12a on the planet 100. This is indicated by an arrow 143 in FIG. 25. As a result, the lifter assembly moves downwardly from the position shown in broken lines in FIG. 25 to the position shown in solid lines in FIG. 25.

Figure 19:
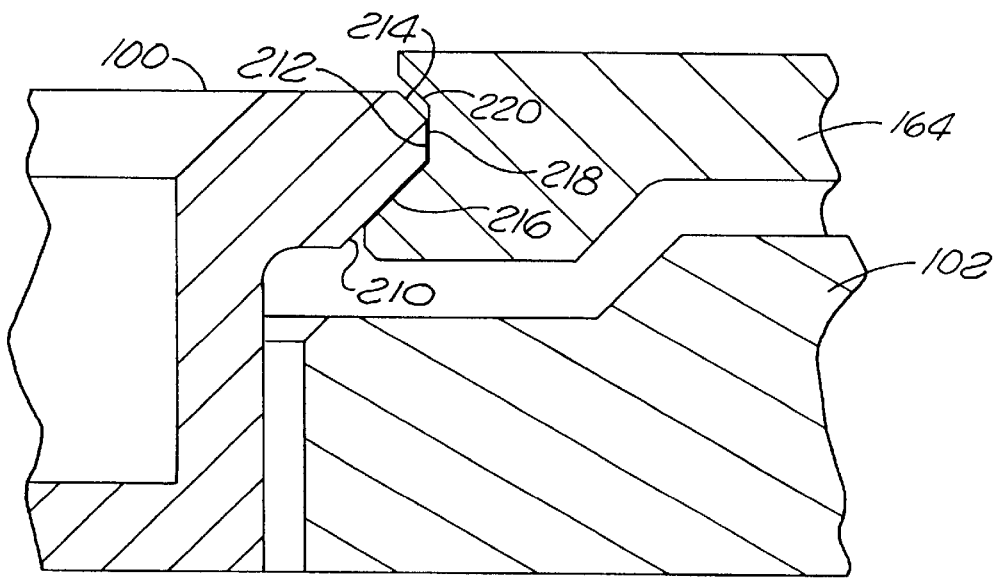
FIG. 19 is an enlarged fragmentary sectional view taken substantially on the line 19—19 of FIG. 15 and shows in additional detail the relationship between the planet, the stator and a turntable in the process module.

As will be seen in FIGS. 19 and 22A, the planet 100 is provided with a lip 144 to receive and support the substrate. The lip 144 is tapered so that, as the substrate 12a settles downwardly on the lip, it is adjusted in position and the precision of the disposition of the substrate on the lip is enhanced. The substrate 12a then becomes disposed on a ledge 145 (FIG. 22A) at the bottom of the lip 144. Substantially only perimeter contact will be provided between the substrate 12a and the planet 100. Such perimeter contact is provided at the four (4) edges of the substrate 12a. These four (4) edges are disposed peripherally exterior to the working area of the substrate 12 where the controlled deposition is provided.

Figure 22:
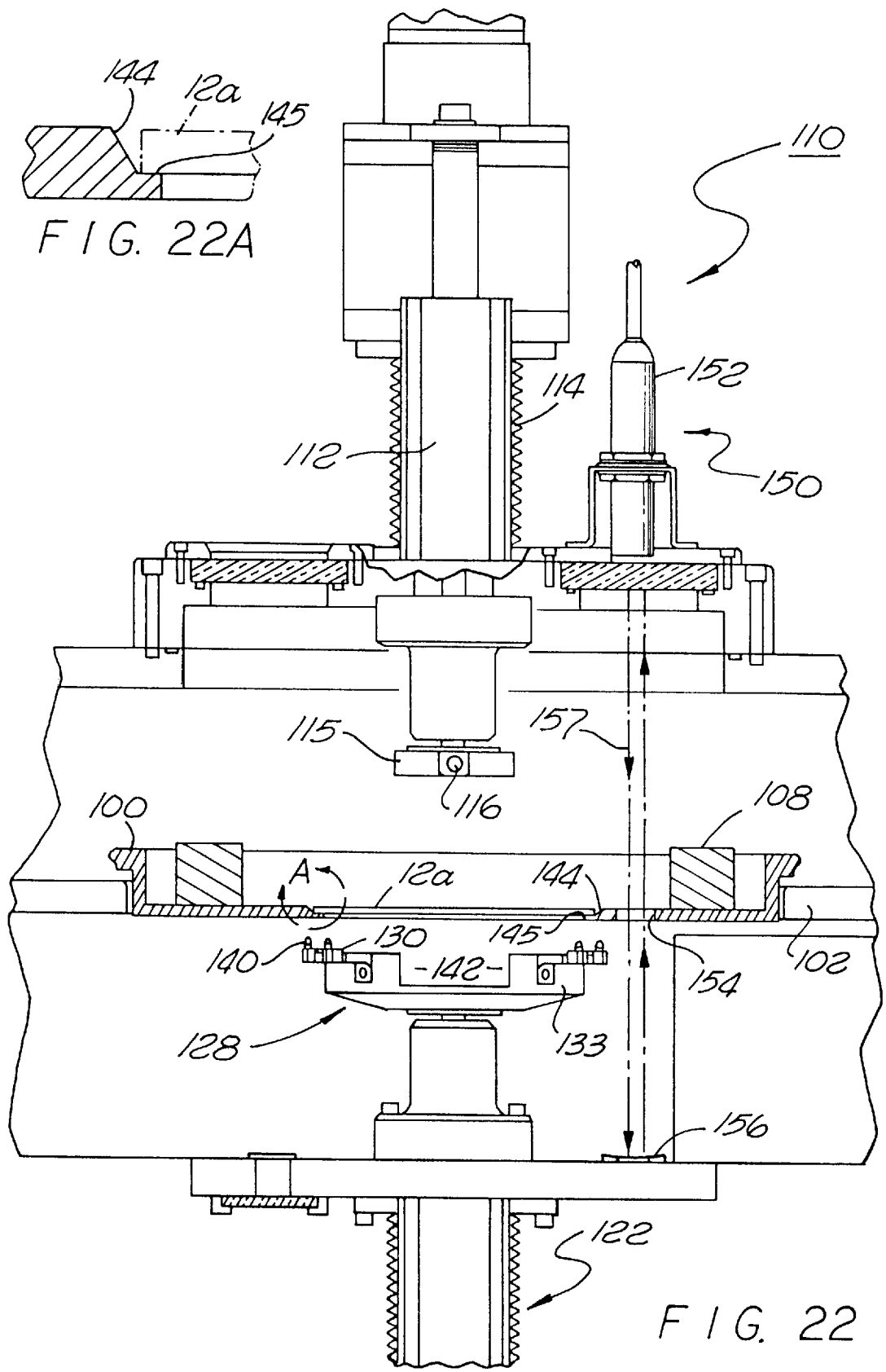
FIG. 22 is a sectional view taken substantially on the line 22—22 of FIG. 20 and shows the in-line relationship in the process module between the planet, an alignment assembly above the planet and the lifter assembly below the planet.

FIGS. 22–25 schematically show the sequential operation of the alignment assembly 110 and the lifter assembly 122. As shown in FIG. 22, the alignment assembly 110 is disposed above the planet 100 in axially spaced relationship to the planet and the lifter assembly 122 is disposed below the planet in axially spaced relationship to the planet. FIG. 23 shows the disposition of the alignment assembly 110 after the axial movement of the alignment assembly downwardly to the planet 100 with the lifter assembly 122 displaced from the planet. This downward movement is illustrated in FIG. 23 by an arrow 145.

In FIG. 23, the drive pin 116 on the alignment assembly 110 engages the pin 120 on the planet 110 and rotates the planet 100 in accordance with the computer controlled operation of the stepper motor 118 (FIG. 14) in rotating the alignment assembly to a precisely controlled position. The incremental movements provided by the stepper motor 118 may be controlled by a sensing unit generally indicated at 150 in FIG. 22. As a result of the rotation of the planet 100a by the alignment assembly 110, the planet is in position to receive the substrate 12a on the end effector 26 when the robotic arm assembly 24 is expanded into the process module 36.

Figure 24:
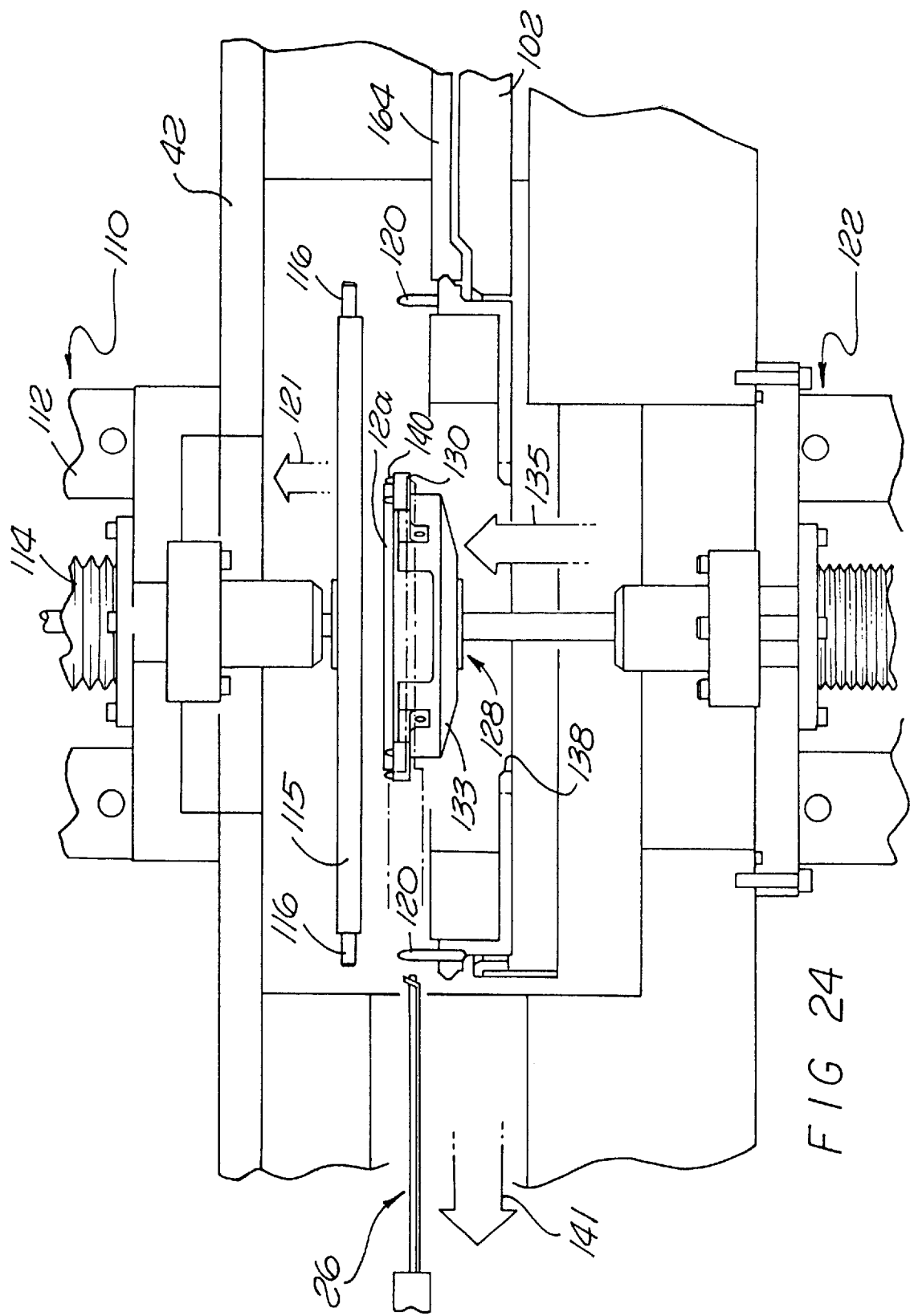
FIG. 24 is a simplified schematic side elevational view similar to that shown in FIG. 23 and shows the alignment assembly in upwardly displaced relationship from the planet and additionally shows the substrate on the lifter assembly as a result of the upward movement of the lifter assembly and shows the end effector in a retracted relationship.

FIG. 24 shows the lifter assembly 122 axially displaced upwardly as indicated by the arrow 135 and shows the substrate 12a on the lifter assembly as a result of this upward movement. It also shows the alignment assembly 110 disposed in an axially aligned position upwardly displaced from the planet 100a as indicated by the arrow 121. It also shows the end effector contracted as indicated by an arrow 141.

Figure 25:
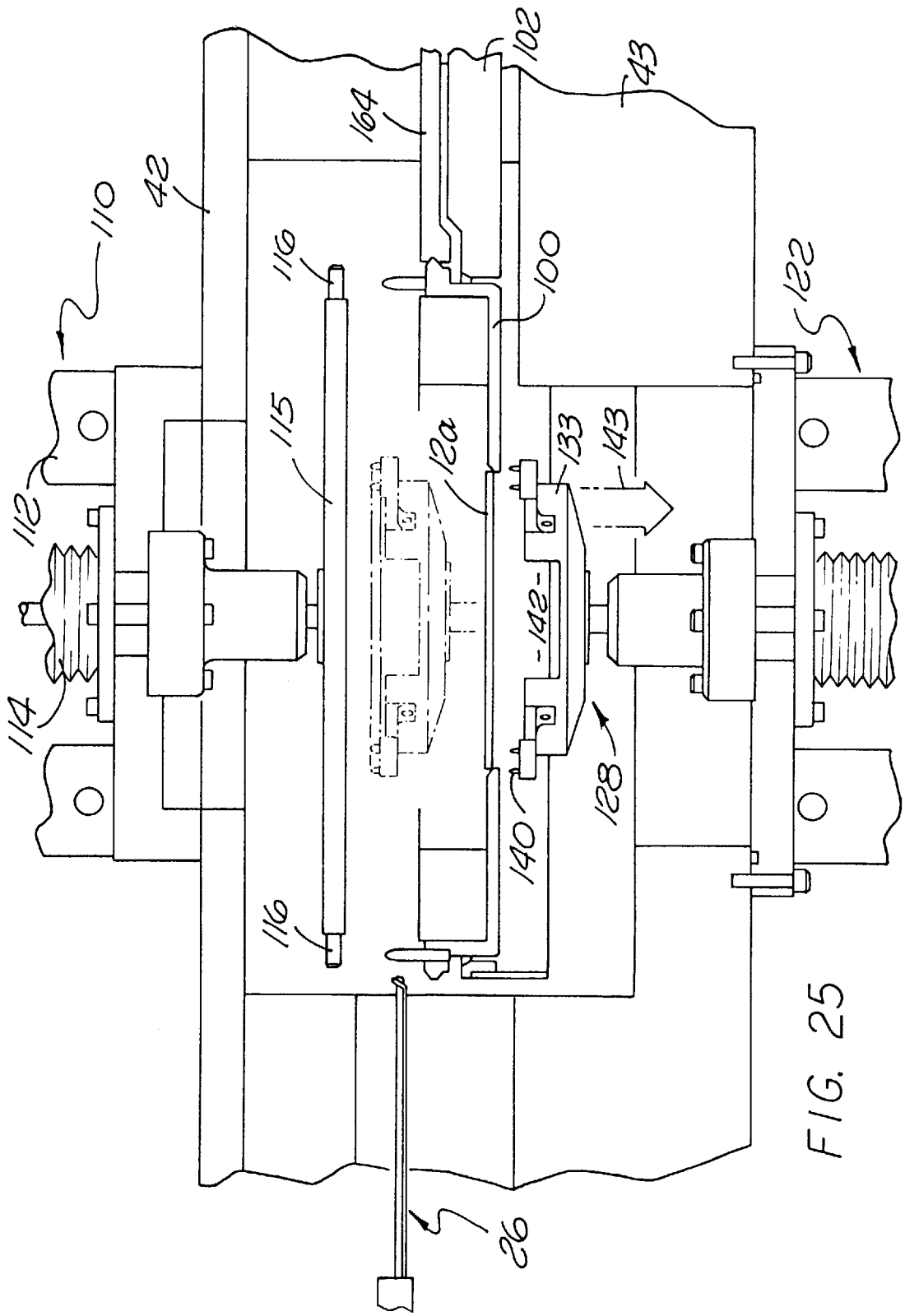
FIG. 25 is a simplified schematic side elevational view similar to that shown in FIGS. 23 and 24 and shows the substrate on the planet and also shows, in broken lines, the lifter assembly in position to lift the substrate from the end effector and additionally shows, in solid lines, the position of the lifter assembly after the lifter assembly has deposited the substrate on the planet.

FIG. 25 shows the lifter assembly 122 in two (2) different positions, one indicated by broken lines and the other indicated by solid lines. The position of the lifter assembly 122 in broken lines corresponds to the position of the lifter assembly in FIG. 24. In this position, the lifter assembly 122 has lifted the substrate 12a from the end effector 26 but has not yet deposited the substrate on the planet 100a. In the position of the lifter assembly 122 in solid lines, the lifter assembly has deposited the substrate 12a on the planet 100 and has moved downwardly and axially to a position axially displaced from the planet. This is indicated by the arrow 143.

FIG. 22 shows the sensing unit, generally indicated at 150, for sensing the rotary position of the alignment assembly 110. The sensing unit 150 includes a sensor 152 for passing light from the sensing unit 150 past the alignment assembly 110 and through a hole 154 in the planet 100 to a reflector 156 on a fixed portion of the lifter assembly 122. This downward movement of the light is indicated by downwardly pointing arrows 157 in FIG. 22.

When the alignment assembly 110 has a particular rotary disposition relative to the reflector 156 on the lifter assembly 122, light from the sensor 152 travels past the alignment assembly 110 and through the hole 154 to the reflector 156, and the light reflected by the reflector 156 passes through the hole 154 and past the alignment assembly to the sensor. The resultant signal on the sensor 152 indicates a homing position. At this homing position, the planet is aligned relative to the end effector 26 to receive the substrate 12a from the end effector.

The discussion above has related to the transfer of the bottom one 12a of the substrates 12 in the cassette 52 to one (the planet 100a) of the planets 100 in the process module 36. It will be appreciated that there are four (4) planets in the process module 36 and that each one of the planets receives a substrate. Thus, when one (1) of the planets 100 has received an individual one of the substrates 12, the turntable 102 rotates the planets on the turntable axis to the position where the next one of the planets has moved to the position for the transfer of the next one of the substrates in the cassette 52 to such planet.

At the same time, the robotic arm assembly 24 in the contracted relationship rotates to face the cassette 52, expands into the cassette to have the end effector 26 select the bottom one of the substrates in the cassette, contracts and then rotates with the end effector through an angle of 180° in the contracted relationship. When the next one of the planets has rotated on its own axis to the position for receiving the substrate 12 on the end effector 26, the robotic arm assembly 24 expands to move the end effector into the process module 36. The substrate 26 is then transferred to such next one of the planets.

In this way, the four (4) bottom substrates 12 in the cassette 52 are transferred in sequence to the four (4) planets 100 in the process module 36. The four (4) substrates are then ready to be processed simultaneously in the process module 36 to receive controlled depositions. Although four (4) planets 100 are provided in the process module 36 in the embodiment of this invention, it will be appreciated that a number other than four (4) planets 100 can be provided in the process module. From the standpoint of the average amount of time to process substrates, more than four (4) planets 100 in the process module 36 may be considered to be more efficient than four (4) modules. However, more than four planets 100 in the process module 36 may be considered to provide a crowding of the planets in the process module.

Figure 14:
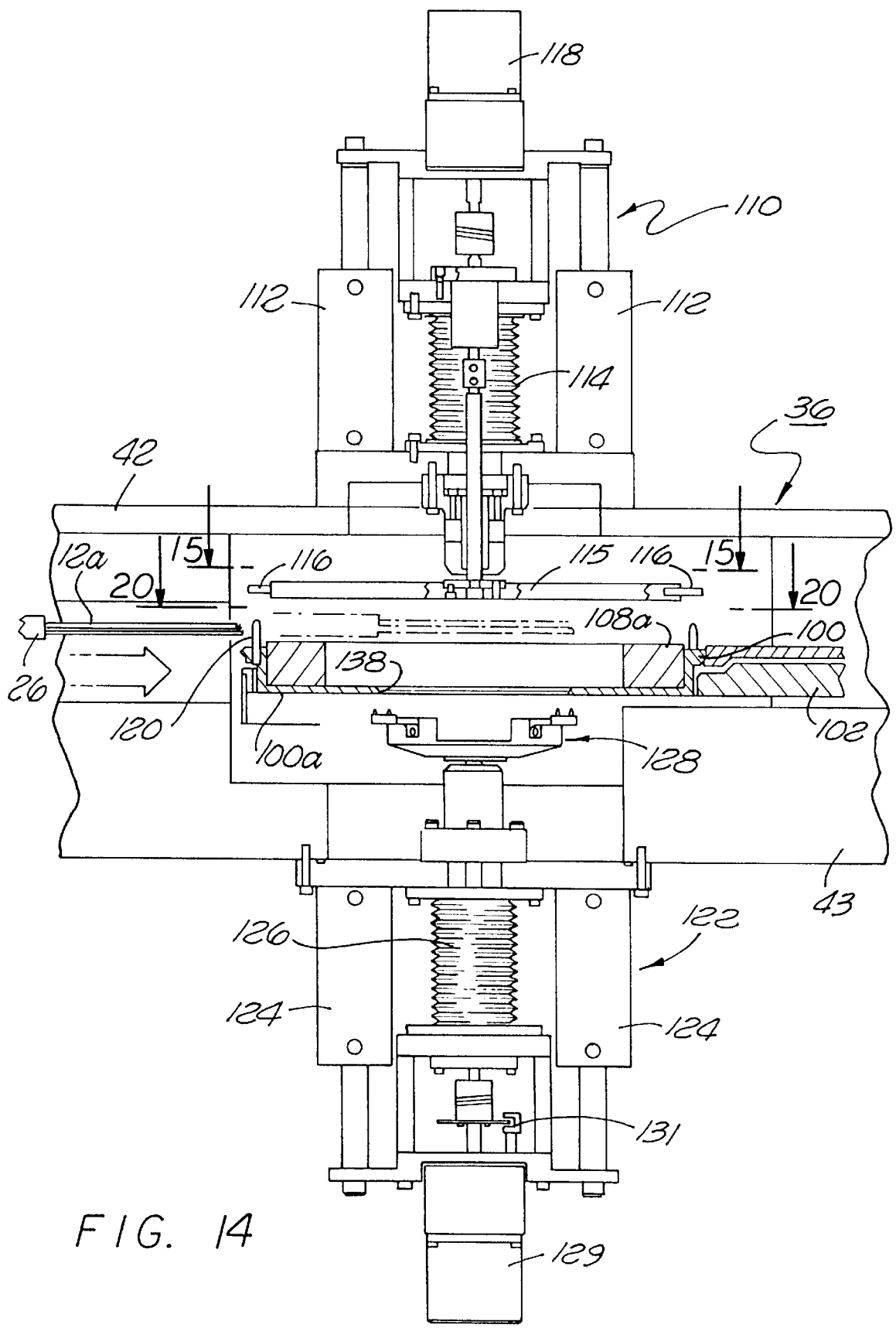
FIG. 14 is an enlarged fragmentary sectional view taken substantially on the line 14—14 of FIG. 4 and shows the construction of the process module in additional detail.
Figure 17:
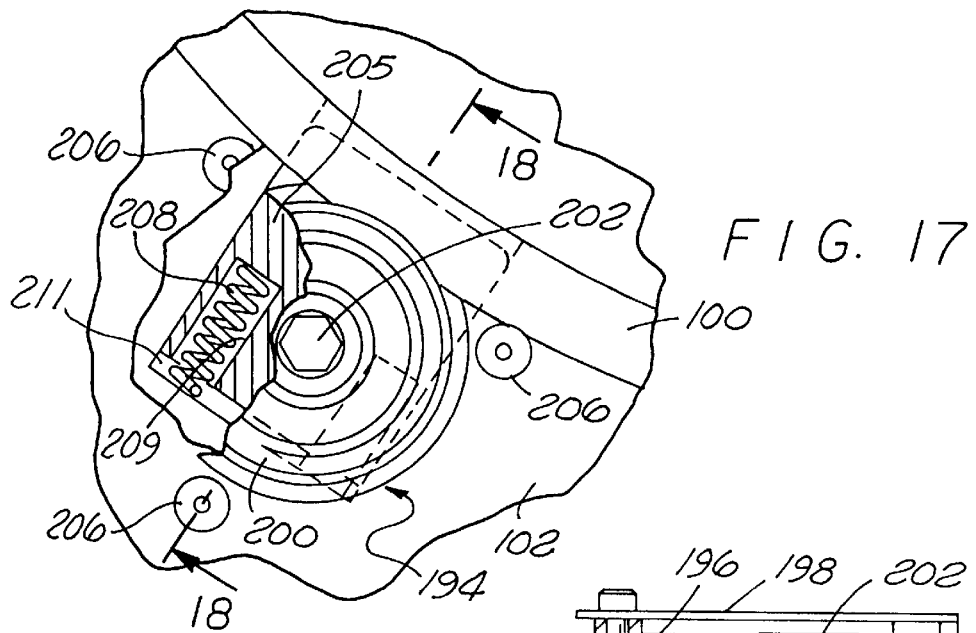
FIG. 17 is an enlarged fragmentary plan view, taken within the circle 17 of FIG. 15, of an idler assembly for pressing the planet against a stator and is partially broken away to show certain components in the idler assembly in additional detail.
Figure 18:
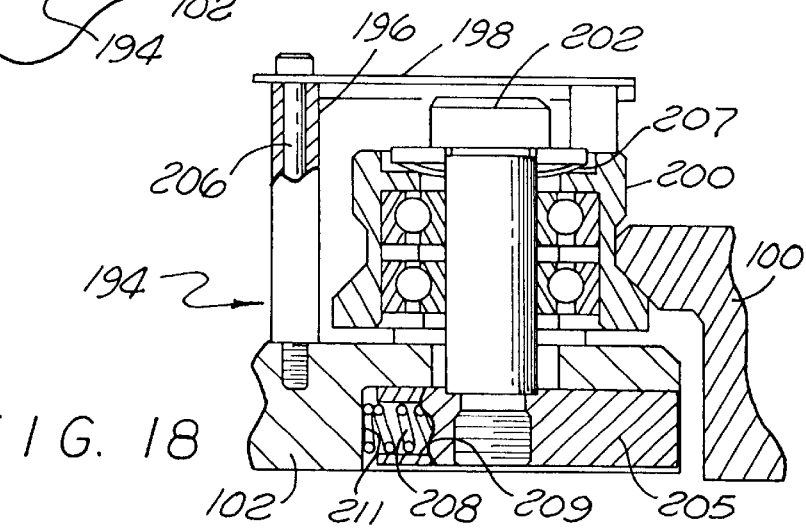
FIG. 18 is a sectional view of the idler assembly and is taken substantially on the line 18—18 of FIG. 17.

In the embodiment shown in FIGS. 24 and 25 and as best seen in FIG. 14, the substrate 12a is disposed on the planet 100a at the bottom of the pole pieces 108. Since the substrate 12 is not centered vertically relative to the pole pieces 108, there may be some bowing or bending in the magnetic field as the flux lines in the magnetic field pass through the substrate.

Figure 26:
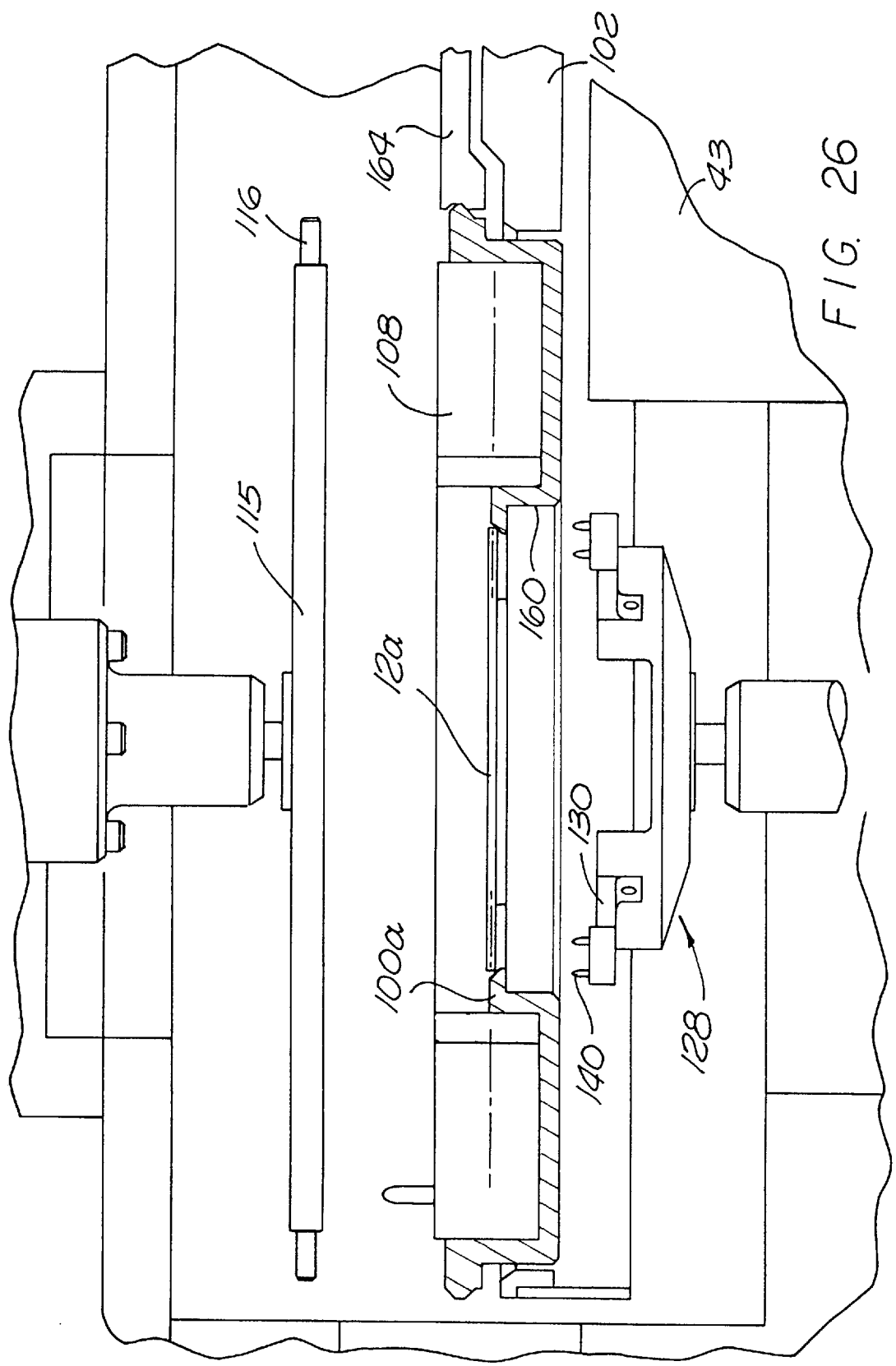
FIG. 26 is a view similar to that shown in FIGS. 24 and 25 with the substrate on the planet and with the lifter and alignment assemblies displaced axially from the planet.

In the embodiment shown in FIG. 26, the planet 100a is provided with an upwardly disposed flange 160 so that, when disposed on the planet, the substrate 12 is positioned at a median position between the top and bottom of the pole pieces 108. This causes the flux lines in the magnetic field to pass through the substrate 12 in a direction substantially perpendicular to the substrate. As a result, there is no bowing of such flux lines.

As will be appreciated, a vacuum is produced in the process module 36 when the controlled deposition is produced on the substrate 12. The vacuum is monitored by a vacuum sensing switch 162 (FIG. 2) extending into the process module 36 from the top of the process module 36. The construction of the vacuum sensing switch 162 is known in the art.

Figure 28:
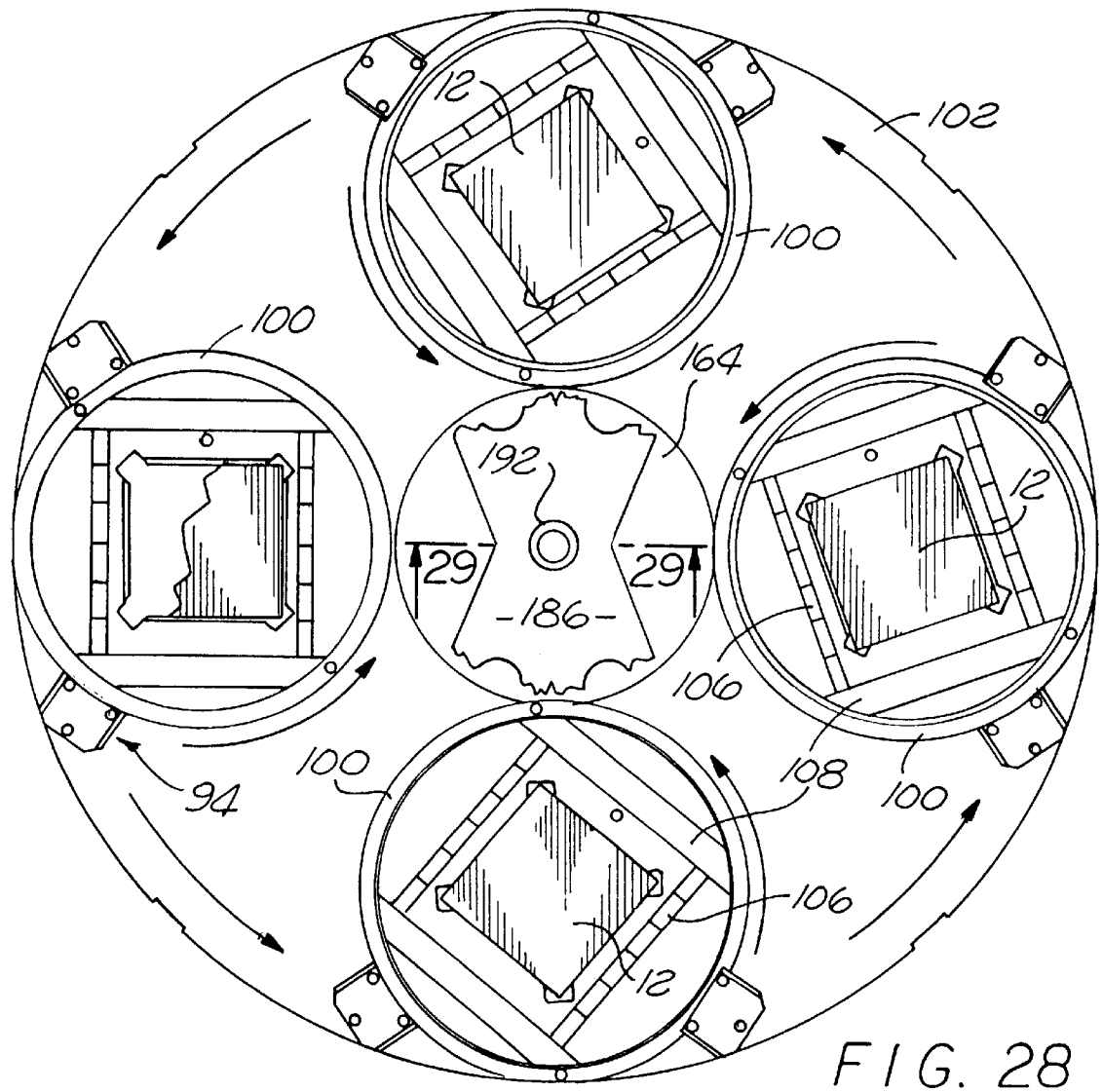
FIG. 28 is a top plan view of the turntable, the stator and the planets and the substrates on the planets.
Figure 29:
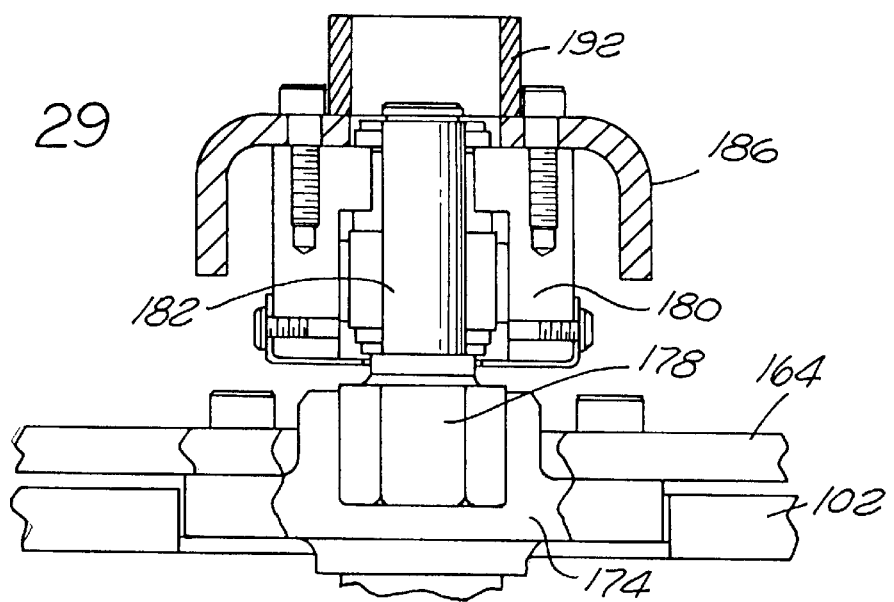
FIG. 29 is a sectional view taken substantially on the line 29—29 of FIG. 28 and shows the turntable and the stator and a one-way clutch for providing for a rotation of the stator in one direction and for preventing the rotation of the stator in the opposite direction.

FIGS. 27–29 show an arrangement for providing the controlled deposition on the substrate when there is a suitable vacuum in the process module 36. The arrangement shown in FIGS. 27–29 incudes the turntable 102, one of the planets 100 (the planet being rotatable on a different axis than the turntable axis) and a stator 164 rotatable on the same axis as the turntable.

The turntable 102 is attached as by bolts 166 (FIG. 27) to the hub 104. The hub 104 is in turn driven by a motor 170 which may be a servo motor and not a stepper motor. The hub 104 may be mounted through a vacuum bearing/seal assembly generally indicated at 167. The assembly 167 provides a radial support for the turntable 102. An axial support for the turntable 102 may be provided by the assembly for the motor 170. The stator 164 is attached as by bolts 172 to a hub 174 co-axial with the hub 104. The hub 174 is rotatable relative to the hub 174 on bearings 176 disposed between the hubs 104 and 174. A hex spline 178 is disposed within the hub 174.

Figure 5:
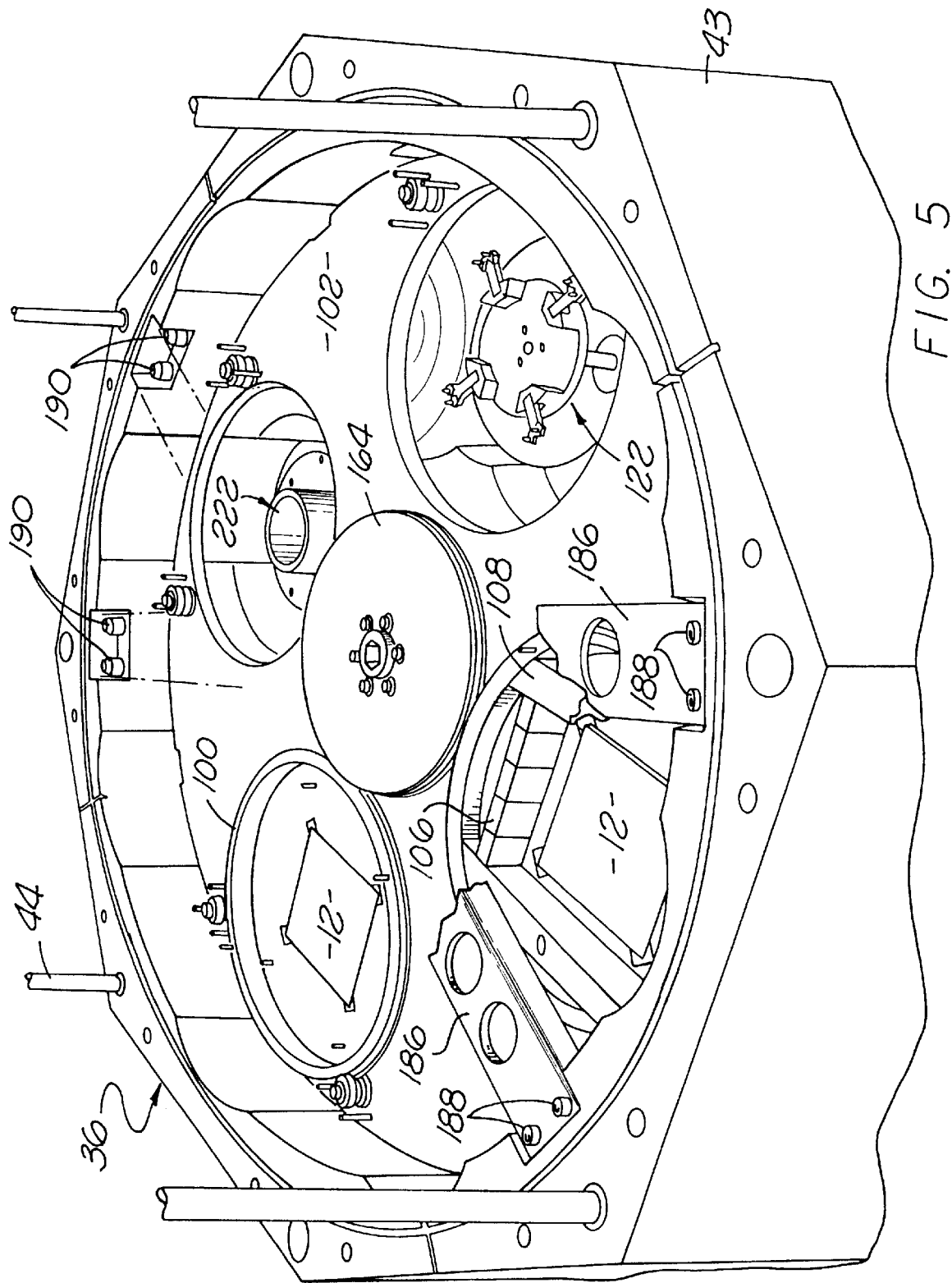
FIG. 5 is a fragmentary perspective view of the process module, as seen from a position above and to the rear of the process module, with the top cover on the process module removed.

A one-way clutch 180 is attached to a shaft 182 (FIGS. 27 and 29) extending from the hex spline 178. The clutch 180 may be a conventional type of one-way clutch. A pair of X-braces 186 are connected as by screws 184 to the clutch 180 such that the center positions of the X-braces are disposed at the axial center of the clutch. The X-braces 186 are disposed at their opposite ends in sockets in the housing 43 and are attached at their opposite ends to the housing as by bolts 188 and 190 (FIG. 5). The cover 42 (FIG. 27) is disposed above the X-braces 186 to enclose the process module 36.

A metal spacer 192 (FIG. 29) is disposed above the X-braces 186 and below the cover 42 (FIGS. 1 and 2). The spacer 192 may be slightly oversized in the vertical direction, thereby causing the cover 42 to be slightly bowed when the process chamber is at atmospheric pressure. This slight bowing is compensated by the differences between the atmospheric pressure above the cover 42 and the pressure inside the process module 36 when there is a vacuum pressure inside the process module.

As previously described, the motor 170 (FIG. 27) rotates the turntable 102 during the time that the planets 100 are being rotated on the turntable axis to position the planets in sequence to receive individual ones of the substrates from the end effector 26. During this time, the stator 164 is rotatable because it is decoupled from the X-braces 186 by the clutch 180. However, the planets 100 are rotated relative to the stator 164 by the alignment assembly 110 to receive the individual one of the substrates 12 from the end effector 26.

After the individual ones of the substrates 12 have been transferred to the planets 100, the planets are rotated during the time that the controlled deposition is being provided on the surfaces of the substrates. This is accomplished by rotating the turntable 102 in a direction opposite to the direction in which the turntable is rotated as described in the previous paragraphs. During the rotation of the turntable 102 in this opposite direction, the one-way clutch 180 is effective in preventing a rotation of the stator 164 against the rotation of the turntable.

When the turntable 102 rotates in the opposite direction, the motion of the planets 100 on the turntable about the stator 164 in turn causes the planets to rotate on their own axis. The rotary speed of the planets 100 is relatively great when driven by the stator 164 in comparison to the movement of the planets in the opposite direction with the turntable. This results from the relative diameters of the stator 164 and the planets 100. The rotation of the planets 100 at a relatively great speed is desirable in providing for the production of a uniform deposition on the surfaces of the substrates 12.

Two idler assemblies generally indicated at 194 in FIGS. 15–19 are provided for pressing each planet 100 against the stator 164. Each idler assembly 194 includes an idler 200 (FIG. 18) disposed in abutting relationship with an associated one of the planets 100 for rotation in accordance with the rotation of the associated planet. Each idler 200 is supported on a pin 202 and is rotatable relative to the shaft as by a ball bearing assembly 204. The pin 202 extends into the turntable 102.

A heat shield 198 is disposed above the idler 200 and is attached to the turntable 102 by retainer pins 206 (FIGS. 17 and 18) which are screwed into the turntable 102 through a stand-off 196 (FIGS. 15 and 16). The heat shield 198 is provided with a reflective surface to reflect heat. A spring washer 207 (FIG. 18) is disposed against the idler 200 to provide a steady force against the idler. The spring washer 207 provides for the tightening of the pin 202 against the spring washer. The spring washer 207 in turn provides a force against the idler 200. The spring washer 207 compensates for slight variances in tolerances in the different components in the idler assembly 194.

Helical springs 208 are disposed in sockets 209 in a slidable block 205 which in turn is disposed within sockets 211. The helical springs 208 apply forces through a slidable block 205 against the planet 100 so that the planet will be coupled to the stator 164 to rotate in accordance with the rotation of the stator. In this way, the idler assembly 194 is free to move radially toward the axis of the turntable 102 because the sockets 211 in the turntable allow the pin 202 to move with the slidable blocks 205.

FIG. 19 is a fragmentary sectional view taken substantially on the line 19—19 of FIG. 15 and shows the relationship between one of the planets 100, the turntable 102 and the stator 164. As will be seen, the stator 164 is disposed above the turntable 102 and the planet 100 is spaced from the turntable in substantially the same horizontal planes as the turntable and the stator. The planet 100 has at progressive vertical positions a lip portion 210 extending radially outwardly in a transverse direction with progressive vertical positions, a substantially vertical portion 212 at the upper end of the lip portion 210 and a lip portion 214 extending, at progressive vertical positions, radially inwardly in a transverse direction from the upper end of the vertical portion 212. The stator 164 has portions 216, 218 and 220 respectively corresponding in disposition and configuration to the portions 210, 212 and 214 of the planet 100.

The transverse lips 210 and 216 respectively on the peripheries of the planet 100 and the stator 164 abut each other. This causes the planet 100 to rotate in accordance with the rotation of the stator 164. The vertical portions 212 and 218 respectively on the peripheries of the planet 100 and the stator 164 also abut each other to facilitate the rotation of the planet 100 with the stator 164. As previously described, each planet 100 may have a tendency to ride upwardly as it rotates because of its relatively heavy weight. The upward movement of each planet 100 is limited by the contiguous disposition of the transverse lips 214 and 220 respectively on the planet 100 and the stator 164.

Figure 20:
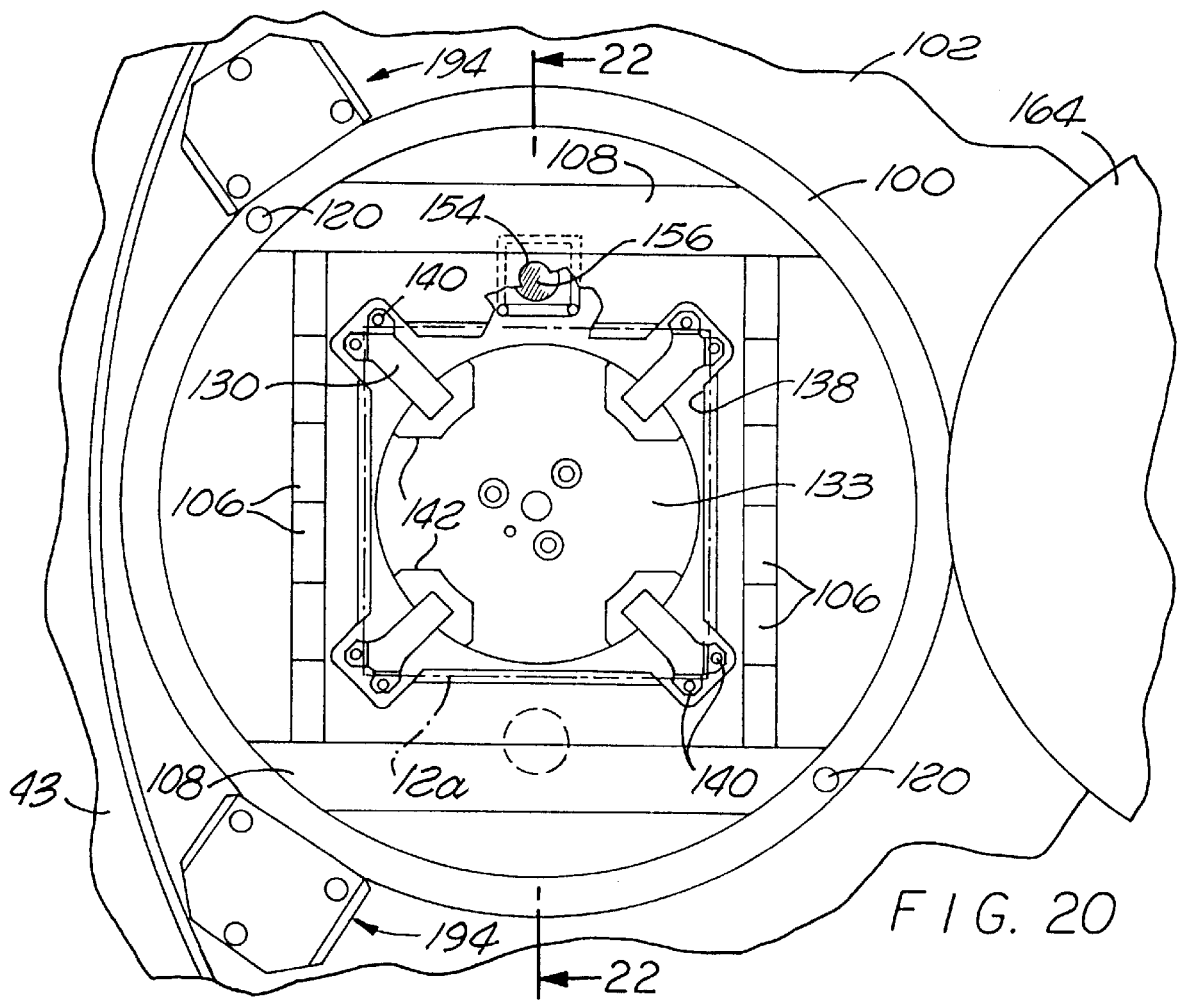
FIG. 20 is a sectional view taken substantially on the line 20—20 of FIG. 14 and shows the disposition of a substrate on a lifter assembly in the process module and also shows the construction of the lifter assembly for receiving the substrate.
Figure 30:
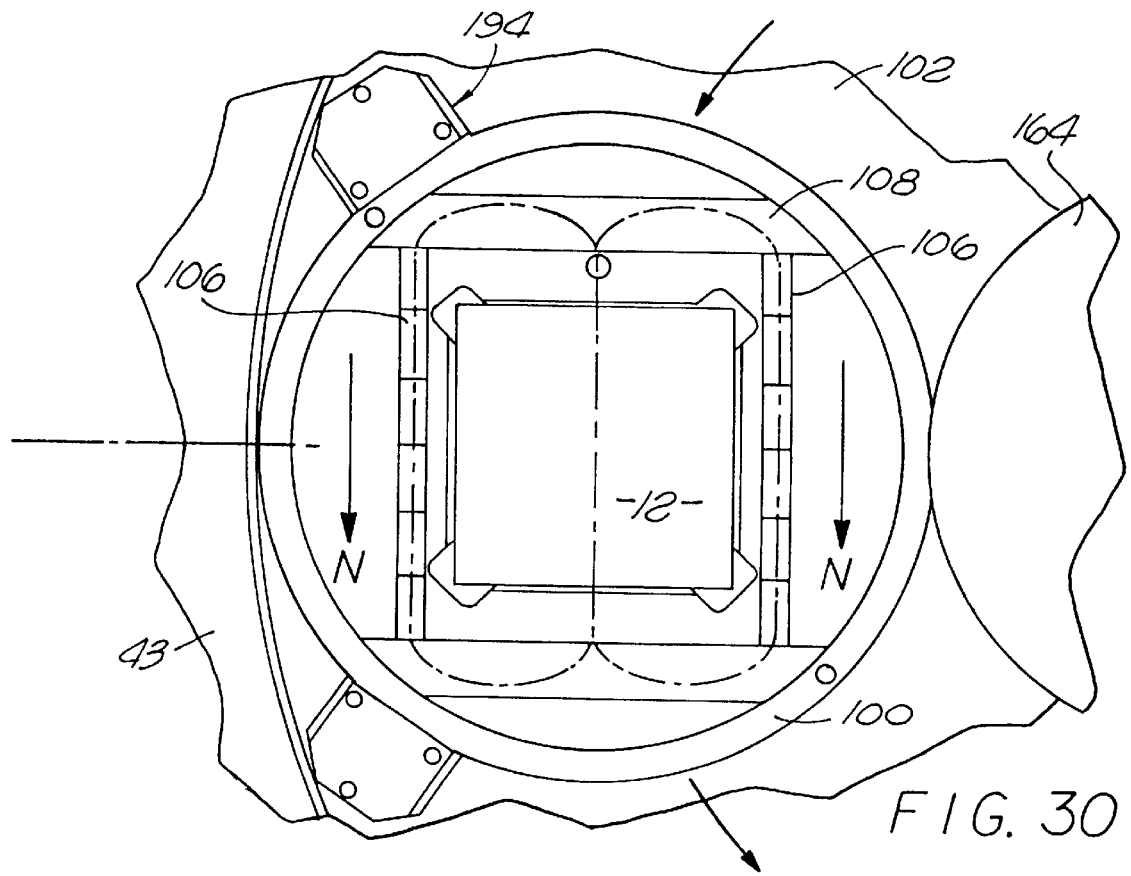
FIG. 30 is a schematic top plan view showing the relative positioning of one of the planets, the substrate on the planet and the magnet assembly for producing the magnetic field during the production of a first controlled deposition on the substrate.
Figure 31:
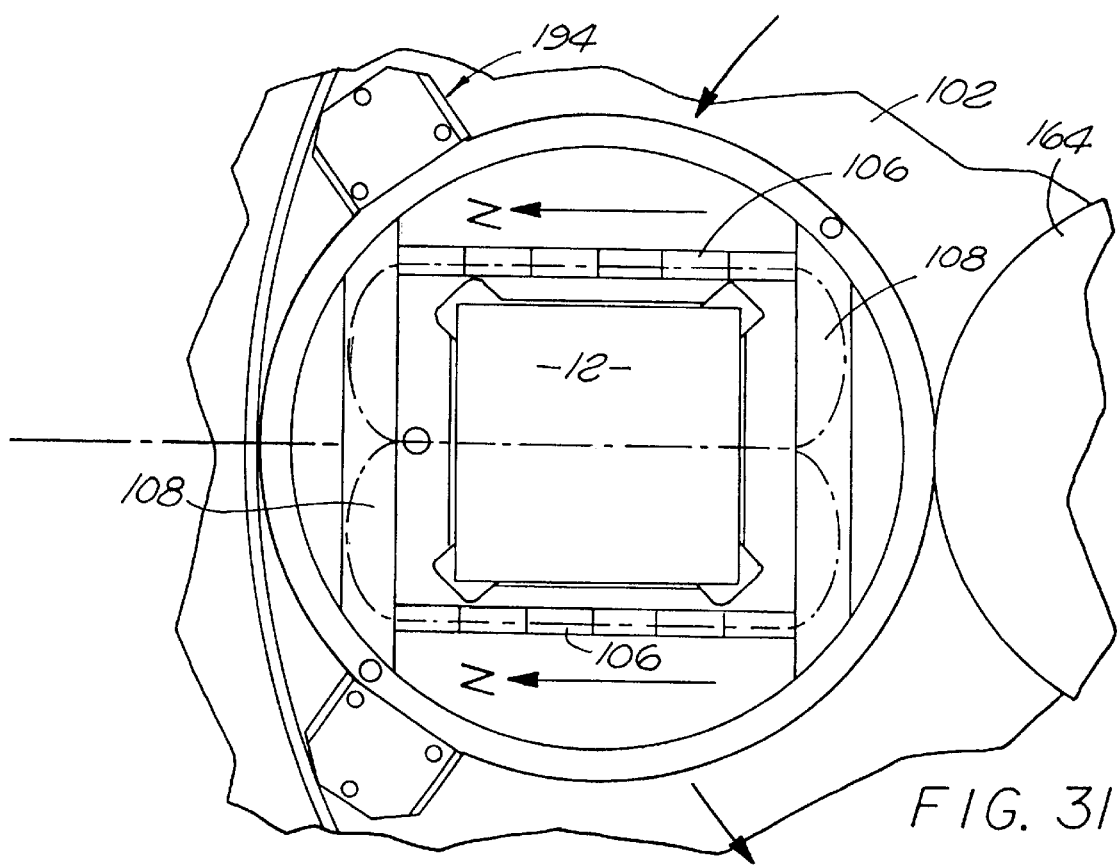
FIG. 31 is a schematic top plan view similar to that shown in FIG. 30 and shows the relative positioning of the planet, the substrate on the planet and the magnet assembly for producing the magnetic field during the production on the substrate of a second controlled deposition substantially perpendicular to the first controlled deposition.
Figure 33:
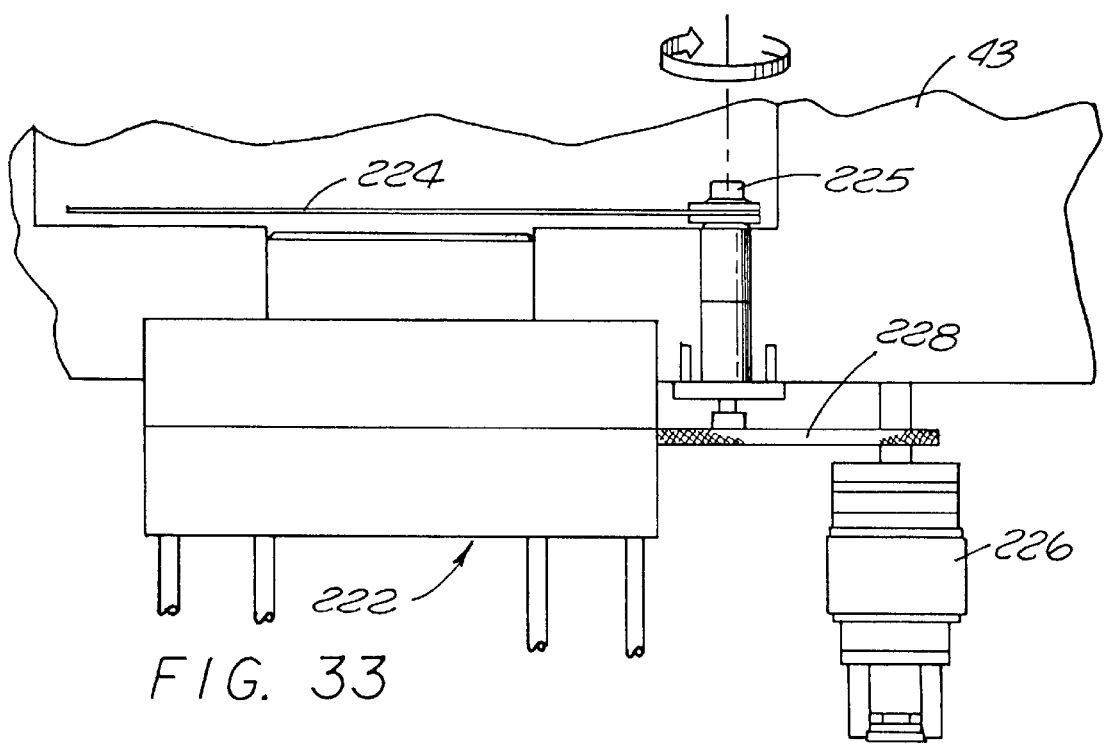
FIG. 33 is a sectional view taken substantially on the line 33–32 of FIG. 32 and shows additional details of one of the guns for providing the controlled deposition on a substrate and of a shutter mechanism for preventing such a deposition.

As previously described, the permanent magnets 106 have a particular disposition such as shown in FIGS. 20, 30 and 31. This causes the magnetic field produced by the permanent magnets 106 and the pole pieces 108 to have a particular disposition relative to the substrates 12 when the substrates are disposed on the planets 100 and are thereafter rotated. In a first rotation of the planets 100, the planets 100 may be considered to have a disposition relative to the permanent magnets such as shown in FIG. 30. During this rotation, a first controlled deposition is produced by a gun, generally indicated at 222 in (FIGS. 27 and 33), on each of the planets.

In order to insure that the controlled deposition is substantially uniform throughout the surface area of each substrate 12, the substrate may be lifted from each associated planet and rotated through an angle of substantially 90° after the completion of the first controlled deposition. Such lifting and rotation of the substrate 12 may be provided by the lifter assembly 122 in a manner similar to that described above. The substrate 12 may then be deposited again on its associated planet 100. The planet 100 is then rotated and the associated gun 222 is operated to produce a second controlled deposition on the substrate. This deposition may have the same characteristics such as thickness as that provided by the first deposition.

In this way, the second controlled deposition compensates for the direction of the magnetic field produced by the permanent magnets 106 and the pole pieces 108 during the first controlled deposition. This may be seen from a comparison in FIGS. 30 and 31 of the disposition of the substrate 12 relative to the permanent magnets 106 in the first controlled deposition (FIG. 30) and the second controlled deposition (FIG. 31). This causes the uniform characteristics of the resultant deposition to be enhanced and the binary bits recorded by the magnetic heads (not shown) incorporating the die on the substrates to be spaced closer together than if only a single deposition is provided on the substrates.

One of the guns 222 is shown in additional detail in FIG. 27. It may be constructed as shown in FIG. 27 in a manner well known in the art. The gun 222 is operated to provide the controlled deposition on one of the substrates 12. However, the gun 222 has a warm-up period during which its operation is not uniform. Thus, if the gun 222 were allowed to provide the deposition on the substrate 12 during this warm-up period, the deposition on the substrate would not be uniform.

To prevent a non-uniform deposition from being provided on the substrate 12, a shutter 224 (FIGS. 32 and 33) is rotated on a post 225 to a position covering the gun 222. The rotation of the shutter 224 to a covering position is provided by a motor 226 and a belt 228 coupled to the motor and to the post 225. When the gun 222 is operating on a steady state basis rather than a transient basis, the shutter 224 is opened to provide for the controlled deposition by the gun on the surface of the substrate 12.

Figure 32:
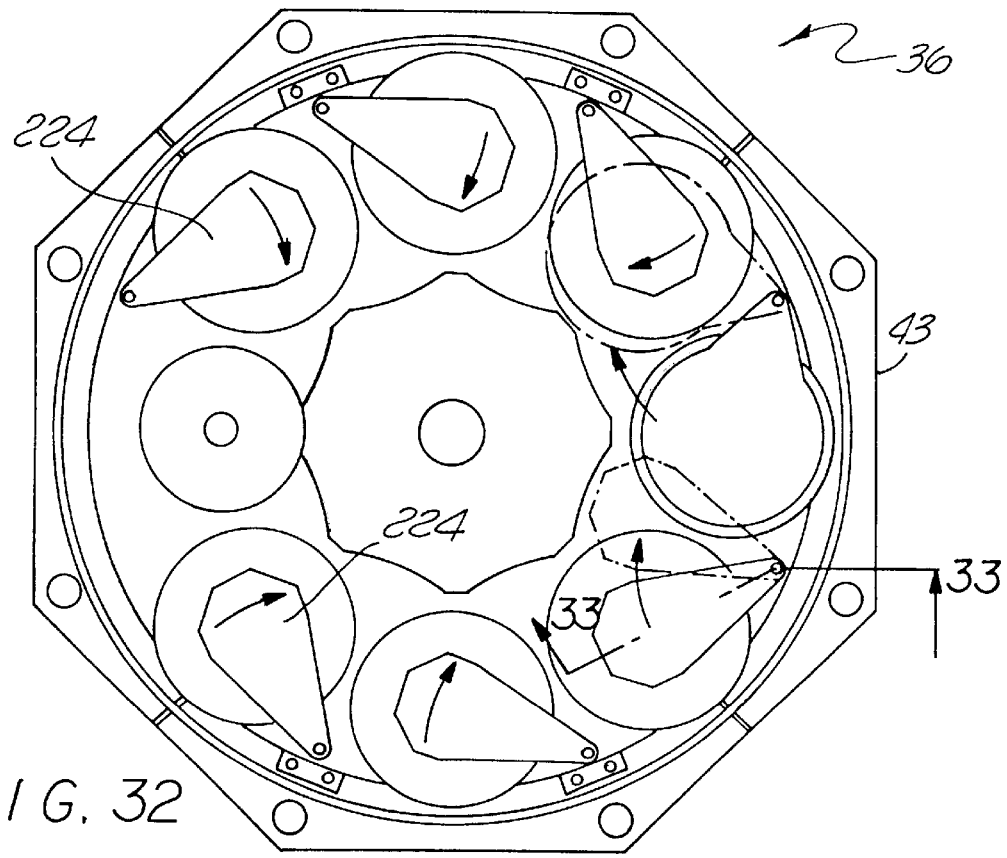
FIG. 32 is a schematic top plan view of the process module with the cover, the turntable and the planets removed and shows the guns in the process chamber with the shutters covering the guns to prevent the guns from producing depositions on the substrates.

As will be seen from FIG. 32, the areas of the shutters 224 are relatively limited. Because of these limited areas, the shutters 224 may not always be able to block the associated guns 222 from providing depositions on the substrates when the shutters are in the closed positions. To overcome this potential problem, shutters 230 may be provided as shown in FIGS. 35 and 36. As will be seen, the shutters 230 have a significantly greater area than the shutters 224. This assures that the shutters 230 will cover the substrates 12 in their closed positions.

In order to provide for the movement of the shutters 230 between the open and closed positions, the housing 43 in the process module 36 is provided with bay windows 233 outboard of the housing for receiving the shutters in the open position of the shutters. The shutters 230 are movable into the bay windows 233 through openings 236 in the housing 43. FIG. 36 shows the shutters 230 in broken lines in the open position and in solid lines in the closed position.

Figure 4:
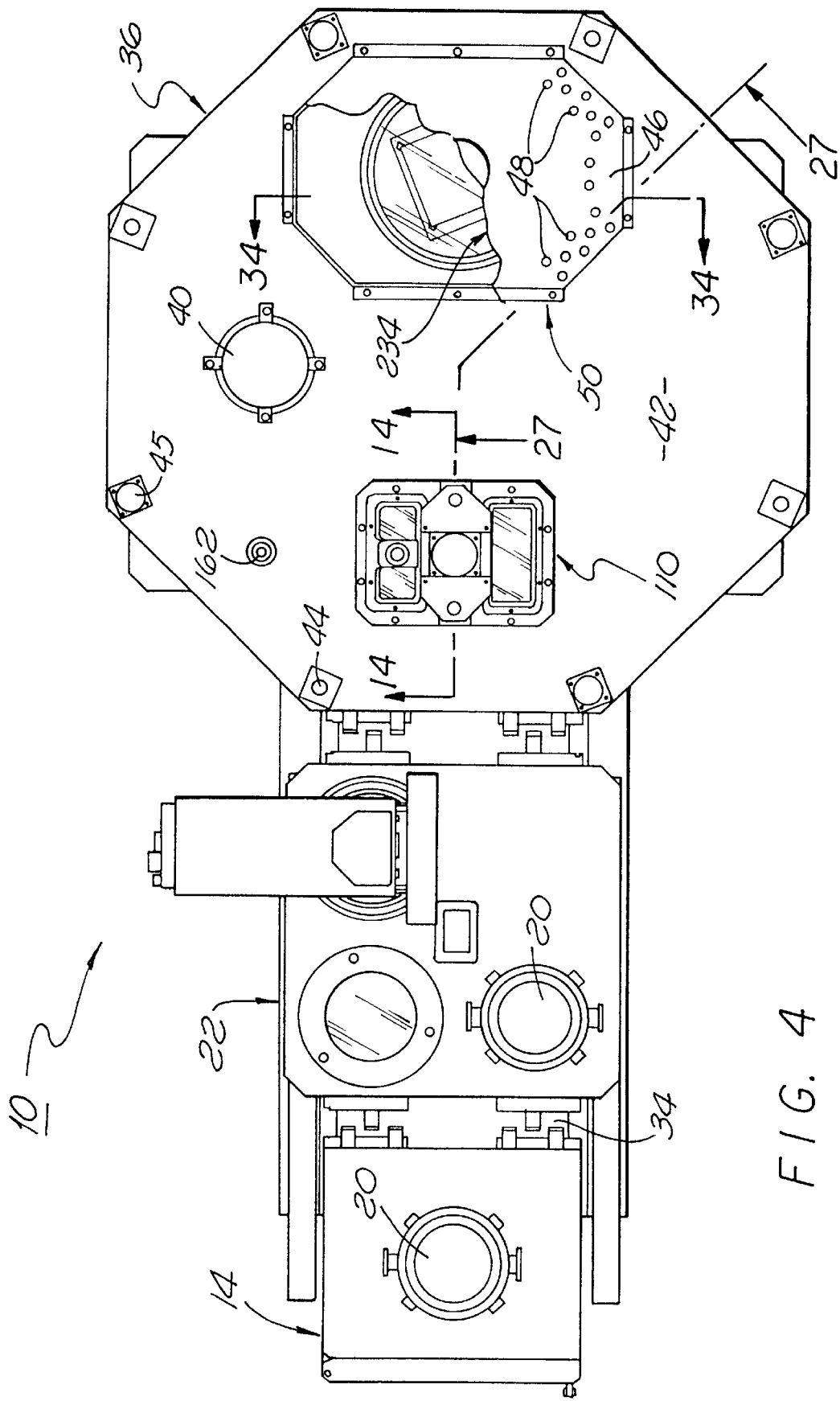
FIG. 4 is a top plan view of the apparatus and shows the cassette module, the transport module and the process module and various components and sub-assemblies at the tops of these modules.
Figure 34:
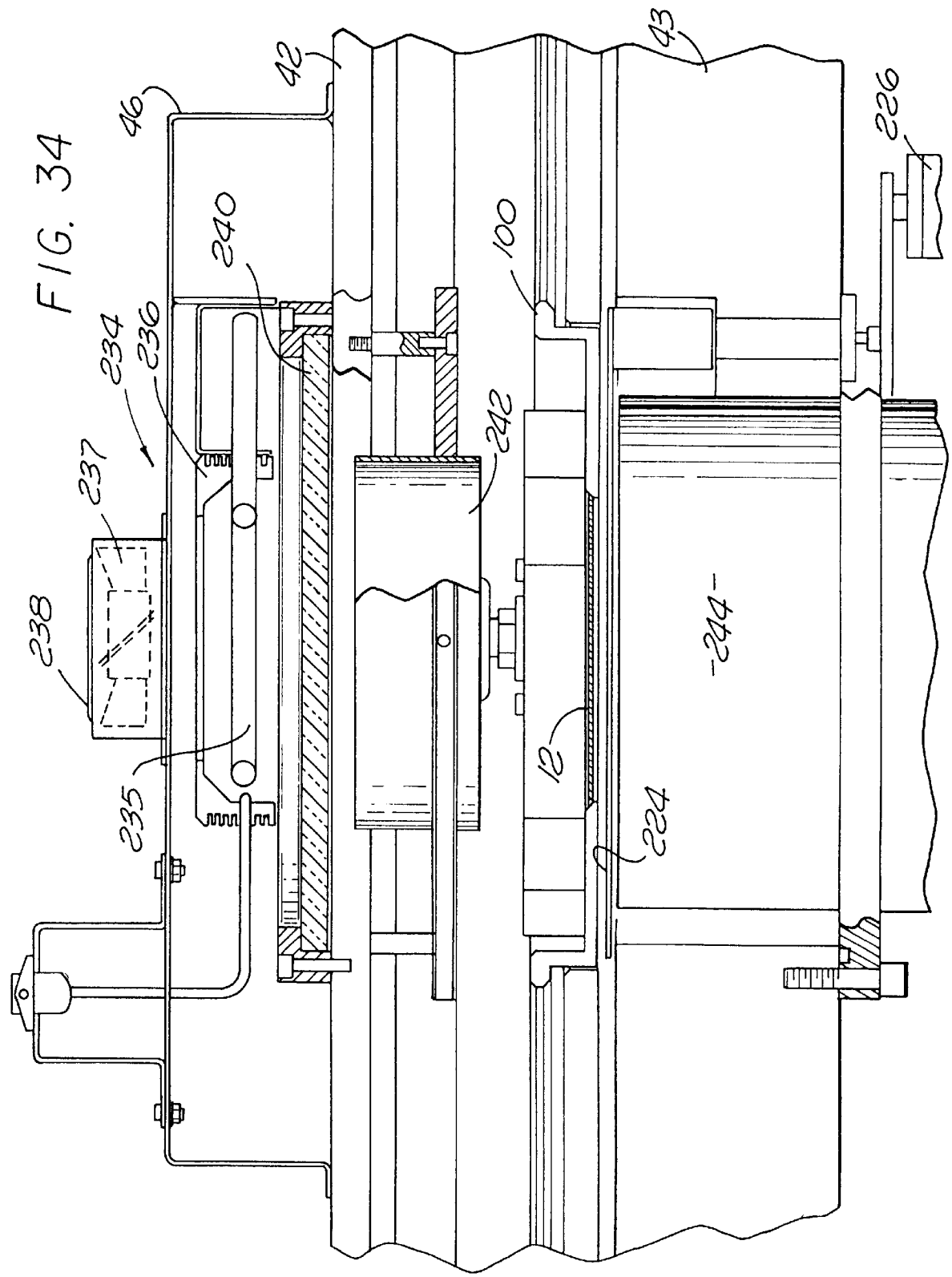
FIG. 34 is a sectional view taken substantially on the line 34—34 of FIG. 4 and shows an arrangement for introducing a controlled amount of heat to the substrate to facilitate the production of the controlled deposition on the substrate.

FIGS. 4 and 34 illustrate an assembly generally indicated at 234 for heating the substrates 12 and for preparing the surfaces of the substrates to receive the controlled deposition. The assembly 234 may be considered to be known in the prior art. The assembly 234 includes a heating element 235 (FIG. 34) such as a quartz halogen heating element. A reflector 236, preferably gold plated, is disposed above the heating element 235 to reflect heat from the heating element downwardly toward the substrate 12. The shield 46 (also shown in FIG. 4) with the apertures 48 is disposed to pass hot air above the reflector 236 into the atmosphere and to introduce cool air into the assembly 234. A fan 237 disposed within a compartment 238 above the reflector 236 to facilitate the passage of cool air into the assembly and the flow of hot air from the assembly.

A window 240 made from a suitable material such as quartz passes the heat from the heating element 235 to the substrate 12. A heat shield 242 disposed between the window 240 and the substrate 12 focusses the heat on the substrate. An ion mill 244 disposed below the substrate 12 etches the bottom surface of the substrate. This is the surface that receives the controlled deposition, which may be a suitable insulating material such as aluminum oxide.

The etching of the bottom surface of the substrate 12 by the ion mill 244 provides a fresh and clean surface for receiving the controlled deposition of the aluminum oxide. This fresh and clean surface provides for an enhanced adherence of the deposition such as aluminum oxide on the surface of the substrate 12 and for an enhanced uniformity of the deposition. The deposition of the aluminum oxide on the surface of the substrate 12 preferably has an index of refraction of at least 1.63 since this index of refraction provides the deposition with dense and hard characteristics.

Figure 3:
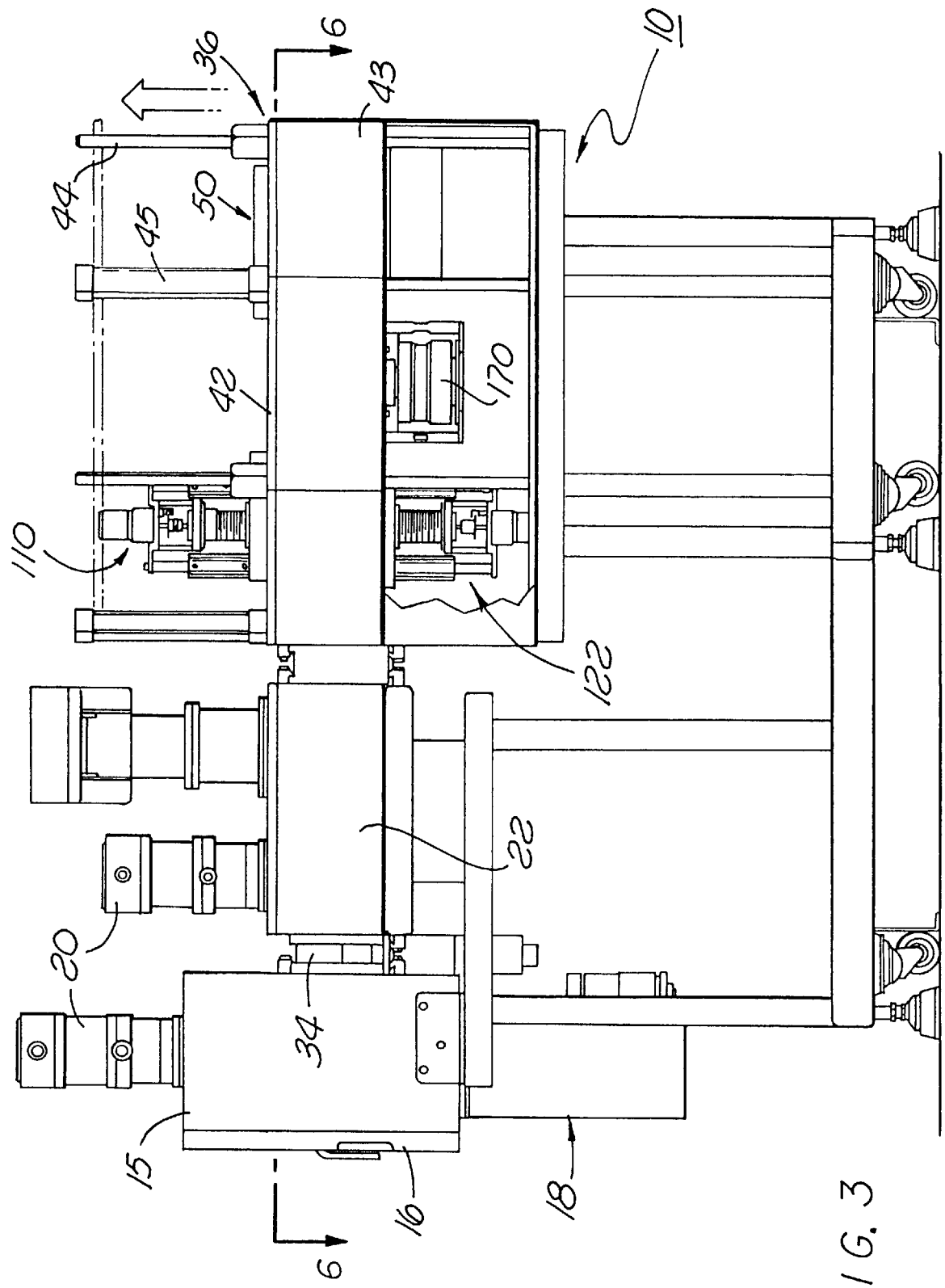
FIG. 3 is a side elevational view of the apparatus and shows the cassette module, the process module and a transport module between the cassette module and the process module.

FIGS. 3, 4 and 5 show the relative disposition of various assemblies in the process module 36. For example, FIGS. 3 and 4 show the disposition of the aligner assembly 110 in the process module, and FIG. 3 shows the disposition of the lifter assembly 122 in the process module 36. FIG. 4 shows the relative disposition of the assembly 234 for heating the substrate 12 and etching the bottom surface of the substrate. FIG. 5 shows the relative disposition of one of the guns 222 for providing the controlled deposition on the substrate 12. FIG. 5 also shows the relative disposition of the lifter assembly 122.

Figure 37:
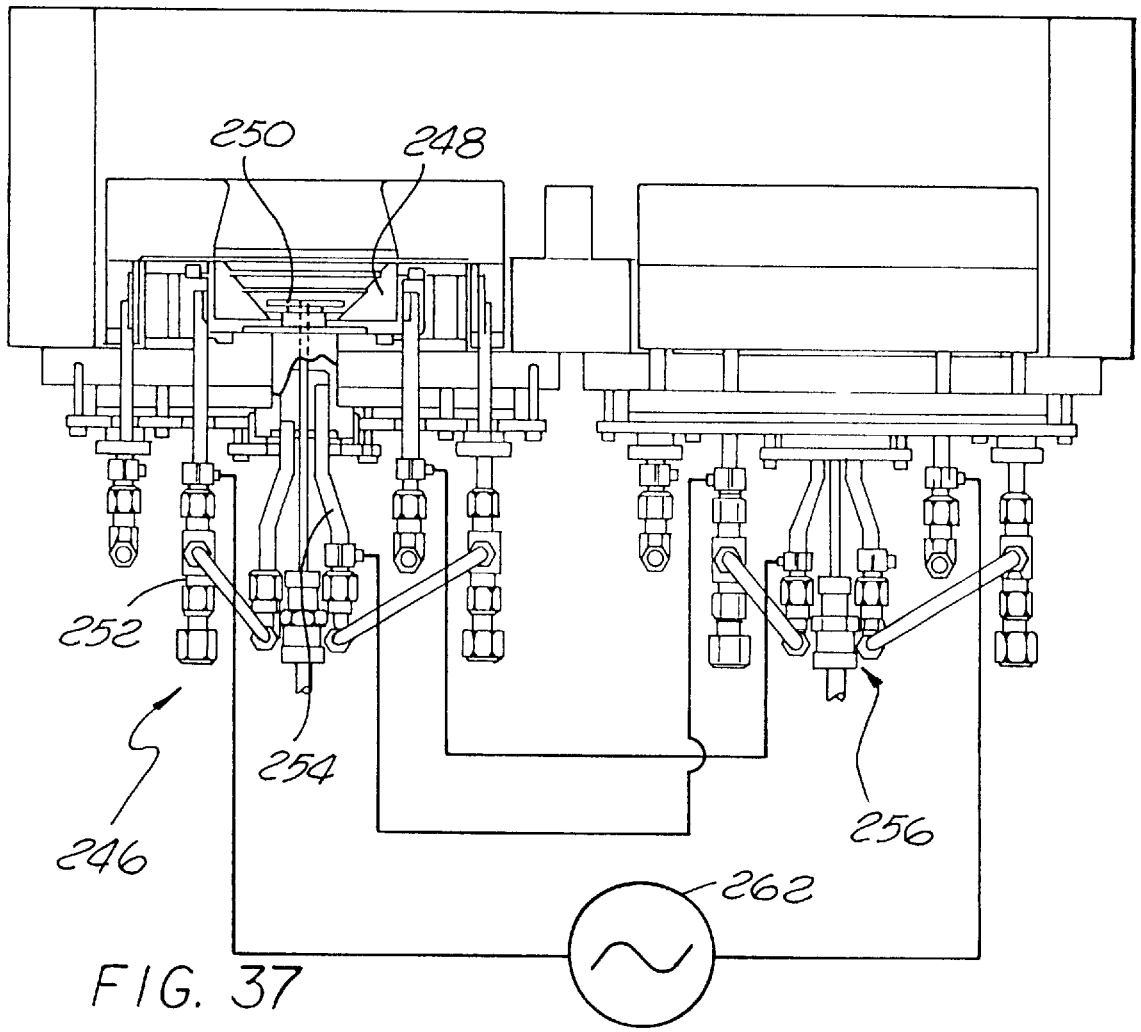
FIG. 37 is a simplified schematic diagram of an improved gun for inclusion in the system of this invention, the gun including a pair of targets and a pair of anodes.
Figure 38:
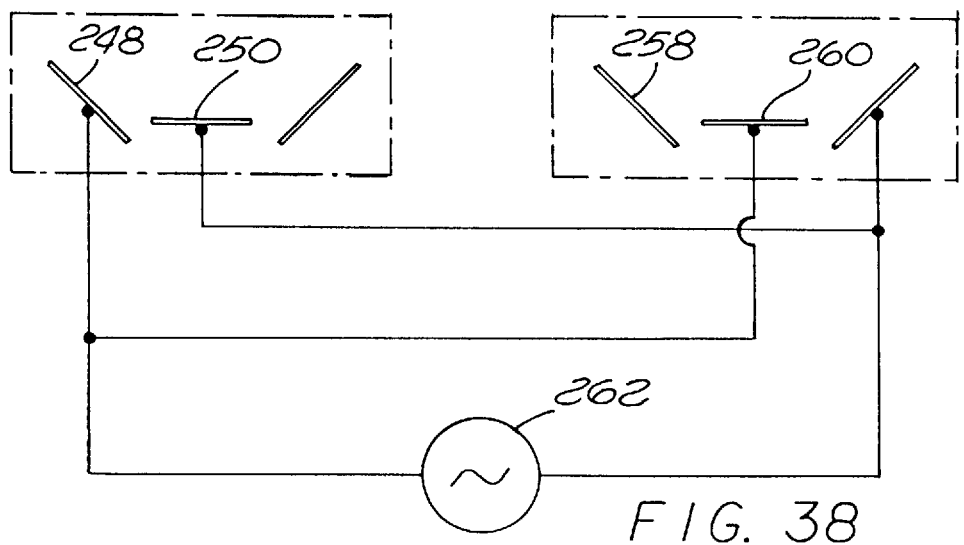
FIG. 38 is a simplified circuit showing the introduction of alternating voltages to the targets and the anodes in the improved gun shown in FIG. 37.

FIGS. 37 and 38 show an assembly generally indicated at 246 for producing sputtered atoms of a material such as aluminum for movement toward the substrate 12. The assembly 246 may be constructed in a manner well known in the art. The assembly 246 includes a target 248 (FIG. 38) which may be hollow and may have a frusto-conical configuration on its inner periphery. An anode 250 may be disposed within the hollow inner periphery of the target 248. Conduits 252 (FIG. 37) may receive de-ionized water for cooling the target. Wires may be passed through the conduits 252 to introduce a voltage to the target relative to the voltage introduced to the anode 250. Conduits 254 may receive water for cooling the anode 250.

An assembly generally indicated at 256 may be constructed in a manner substantially identical to that shown in FIG. 37 for the assembly 246. The assembly 256 is provided with a target 258 substantially corresponding to the target 246 and with an anode 260 substantially corresponding to the anode 250. As shown in FIG. 38, the target 248 and the anode 260 are connected to one terminal of a source 262 of alternating voltage. The source 262 may provide the alternating voltage at a suitable frequency such as a frequency between approximately forty kilohertz (40 Khz) and approximately one hundred Kilohertz (100 KHz). The target 258 and the anode 250 are connected to the other terminal of the alternating voltage source 262. The combination of the assemblies 246 and 256 is considered to be well known in the art. The arrangement shown in FIG. 38, including the connections to the voltage source 262, is also considered to be unique to the system and method of this invention.

In alternate half cycles of the alternating voltage from the source 262, the target 248 receives a negative voltage and the anode 250 receives a positive voltage. In these alternate half cycles, the electrons emitted from the anode 250 travel in a circuitous path to the target 248. The path is circuitous because of the electrical field in one direction between the anode 250 and target 248 and because of the magnetic field produced by the permanent magnets 106 and the pole pieces 108 in a direction substantially perpendicular to the electrical field. This circuitous path for the movement of the electrons enhances the ionization of argon molecules by the electrons. The argon molecules are disposed in the space between the target 248 and the anode 250.

The enhanced ionization of the argon molecules in turn enhances the sputtering produced by the argon molecules of the atoms of the element such as aluminum from the surface of the target 248. In the other half cycles of the alternating voltage from the source 262, the anode 250 receives a negative voltage and the target 248 receives a positive voltage. This interrupts the flow of electrons from the anode 250 to the target 248 and causes the electrons to flow in a direction away from the target and toward the anode.

By controlling the flow of electrons in this manner, the number of the electrons in the space between the target 248 and the anode 250 is increased. This increases the rate of producing argon atoms in the space between the target 48 and the anode 250 and increases the rate at which atoms are sputtered from the surface of the target and deposited on the substrate 12.

In like manner, electrons flow from the anode 260 to the target 258 in the other half cycles. In the alternate half cycles, the negative voltage on the anode 260 causes the flow of electrons to the target 258 to become interrupted and the electrons to flow toward the anode 260. Thus, the assembly 256 operates in the same manner as the assembly 246 except that it is 180° out of synchronization with the assembly 246.

The substrate 12 rotates on an axis such that the assembly 246 is disposed on one side of the axis and the assembly 256 is disposed on the other side of the axis. In this way, the assemblies 246 and 256 act in opposite phases on opposite sides of the substrate 12 on the planet 100. By providing alternating voltages between the anode and the cathode in each of the assemblies 246 and 256, the effectiveness of the electrons in producing ions from the argon molecules in the space between the anode and the target is enhanced. This results from the fact that the electrons travel in alternate half cycles from the anode to the target and in the other half cycles from the target to the anode, thereby increasing the opportunity of the electrons to impinge upon and ionize argon molecules. It also results from the fact that two (2) assemblies (246 and 256) act upon the substrate in each revolution of the substrate in sputtering atoms on the surface of the substrate. Furthermore, two (2) assemblies act in phase opposition to each other.

Applicants have discovered that the uniformity of the controlled deposition on the surface of each substrate 12 can be even further enhanced by providing a shutter 264 shown schematically (FIG. 39) at a particular position at or near the periphery of each planet 100. The shutter 264 is fixedly disposed relative to the associated planet 100 by extending the shutter radially inwardly from a position at the external periphery of the planet to a position between the external periphery of the planet and the center of the planet. The operation of the shutter 264 in enhancing the uniformity of the controlled deposition on the substrate 12 is not fully understood at this time.

Figure 40:
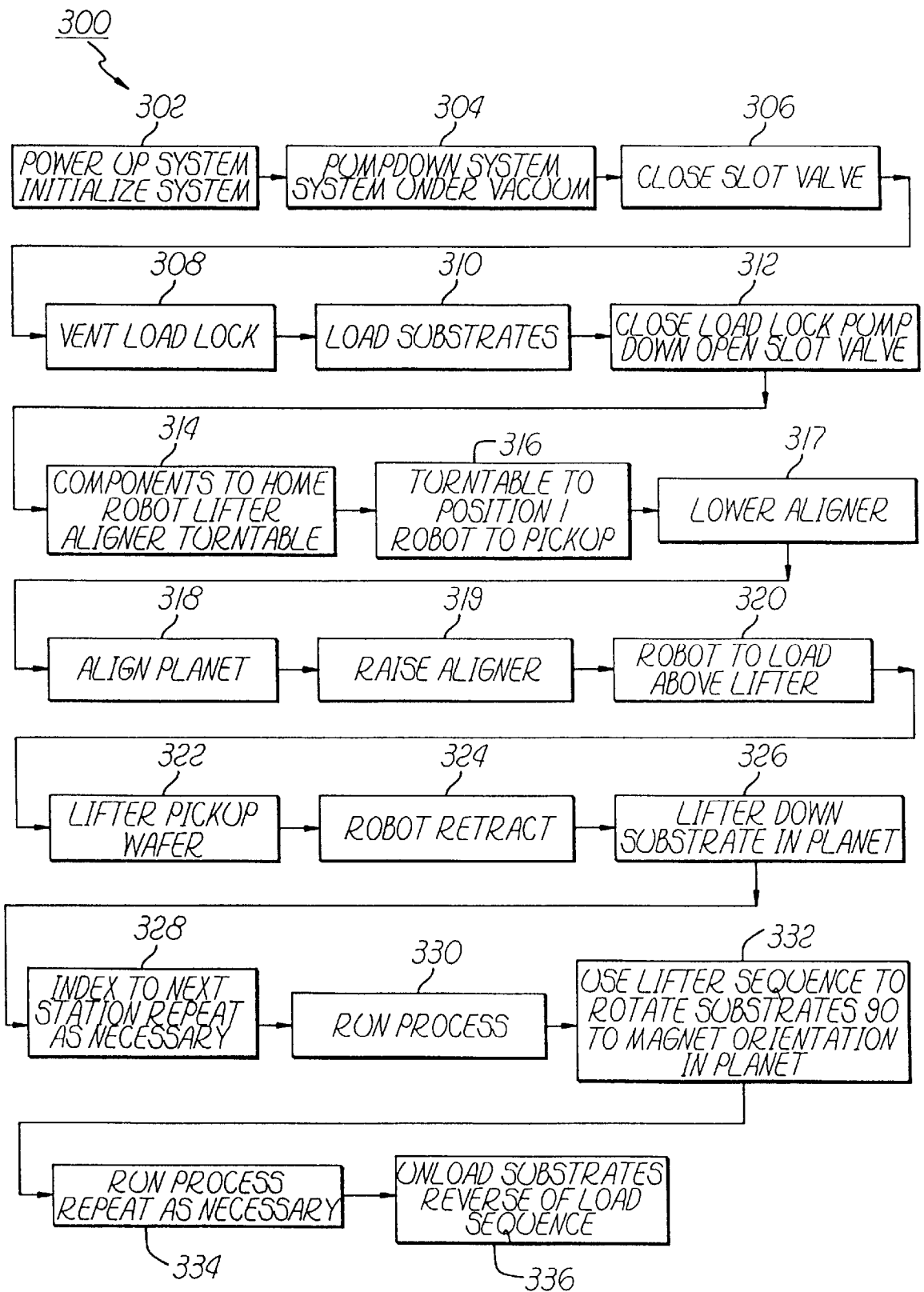
FIG. 40 is a flow diagram showing, on a simplified basis, the successive steps in the operation of the apparatus shown in the previous Figures.

FIG. 40 is a flow chart, generally illustrated at 300, illustrating the operation of the apparatus shown in FIGS. 1–39 and described above. As a first step in such operation, the system is powered up to provide a steady state operation of the different components, including voltage supplies, in the system. The system is also initialized. For example, the cassette 52 is moved to the position where the first substrate can be disposed on the cassette. The power up and initializing step is shown at 302 in FIG. 40.

As a next step, the system is pumped down to provide a vacuum in the cassette module 14, the transport module 22 and the process module 36. This step is illustrated at 304 in FIG. 40. The slot valve 34 between the cassette module 12 and the transport module 22 is then closed to isolate the transport module from the cassette module. A block 306 in FIG. 40 illustrates this step. The load lock 15 is then vented to the atmosphere as illustrated by a block 308 in FIG. 40, and the substrates 12 are loaded in the cassette 52 as illustrated at 310. The load lock 15 (FIG. 1) is then closed and the slot valve 34 is opened. A vacuum is then produced in the cassette module 14, the transport module 22 and the process module 36. This is illustrated at 312 in FIG. 40.

The different components are subsequently moved to their home positions as illustrated at 314 in FIG. 40. For example, the robotic arm assembly 24 is moved to a contracted relationship with the end effector 26 facing the cassette module 22. The alignment assembly 110 is moved axially upwardly to a position displaced from any of the planets 100 and the lifter assembly 122 is moved axially downwardly to a position displaced from any of the planets 100. The turntable is also rotated to a home position pre-programmed into the microprocessor 147.

The turntable 102 is then moved to a particular position providing for a disposition of one of the planets 100 in axially aligned relationship with the alignment assembly 110 and the lifter assembly 122. This rotation is pre-programmed into the microprocessor 147. At the same time, the robotic arm assembly 24 is expanded to move the end effector 26 into the cassette module 14 so that the end effector can receive the bottom one of the substrates 12a in the cassette module 52. The cassette 52 is then moved downwardly to deposit the substrate 12 on the end effector 26. The robotic arm assembly 24 is then contracted and the robotic arm assembly and the end effector 26 are rotated through an angle of 180° so that the end effector faces the process module 36. A block 316 illustrates the steps described in this paragraph.

The alignment assembly 110 is now moved downwardly (see block 317) so that the pin 116 (FIG. 23) in the alignment assembly engages the pin 120 on the planet 110a. The alignment assembly 110 then rotates the planet 100a to position the planet for receiving the substrate 12a on the end effector 26. The step for providing such alignment is illustrated at 318 in FIG. 40. This step is provided under a control of the microprocessor 319 in FIG. 1. (The microprocessor 319 is shown in FIG. 1 as being connected by a bus 321 to the process module 36). The alignment assembly is then moved upwardly (block 319) to withdraw the alignment assembly from the planet 100a. The robotic arm assembly 24 is then expanded to move the substrate 12a to a position above the planet 100a and the lifter assembly 122. This is illustrated at 320 in FIG. 40.

The lifter assembly 122 is now moved axially upwardly into position for receiving the substrate 12a on the end effector 26. A block 322 in FIG. 40 illustrates this step. The robotic arm assembly 24 is then contracted so that the end effector is out of the way of the lifter assembly 122. The contraction of the robotic arm assembly is illustrated at 324 in FIG. 40.

The lifter assembly 122 is now moved axially downwardly to have the lifter assembly deposit the substrate 12a on the planet 100a, as illustrated at 326 in FIG. 40. The lifter assembly 122 is then moved axially downwardly to a position axially displaced from the planet 100a. The turntable 102 is then indexed by the microprocessor so that the next one of the planets 100 in the rotary direction is axially aligned with the alignment assembly 110 and the lifter assembly 122.

The steps described above and shown in blocks 318–326 are now performed to dispose the next one of the substrates 12 in the cassette 52 on the next one of the planets 110. The steps described in this paragraph are then performed until all of the planets 100 have received individual ones of the substrates 12. The steps described in this paragraph and the previous paragraph for disposing the substrates 12 on the planets 100 are illustrated at 328 in FIG. 40.

The first controlled depositions are now provided by the guns 222 on the substrates 12 in the process module 36 as illustrated at 330 in FIG. 40. When the first controlled depositions have been completed, the substrates 12 are lifted in sequence by the lifter assembly 122 and the substrates 12 are rotated through an angle of 90° and deposited again on their respective planets 100. This is illustrated at 332 in FIG. 40. The second controlled depositions are now provided by the guns 222 on the substrates as illustrated at 334 in FIG. 40.

After the first and second controlled depositions have been provided on the substrates 12 in the process module 36, the substrates 12 are returned to the cassette module 14 for removal from the cassette module. The sequence of steps for providing the return of the substrates 12 to the cassette 52 in the cassette module 14 is the inverse of the steps shown in blocks 304–334. This inverse of such steps is indicated by a block 336 in FIG. 40.

The apparatus and method described above have certain important advantages. They provide for a full sequence of operations—from the step of loading the substrates into the cassette module to the disposition of the substrates on the planets 100 and then to the controlled depositions on the substrates. They also provide for a full sequence in an inverse order to provide for a return of the substrates 12 to the cassette 52 after the controlled depositions have been provided on the substrates.

A number of the components and sub-assemblies in the cassette module 14 and the process module 36 are also considered unique in applicants' system. For example, the relationship between the turntable 102, the stator 164 and the planet 100 in positioning the substrates 12 for disposition on the planets 100 and in providing for the controlled depositions on the substrates are considered to be unique in the apparatus and method of this invention. The construction and operation of the alignment assembly 110 and the lifter assembly 122 are also considered to be unique in the apparatus and method of this invention. The controlled movements of the substrates 12 to the position for transfer to the planets 100 are also considered to be unique to the apparatus and method of this invention.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. Apparatus for providing a controlled deposition on a substrate, comprising, a planet, a lifter assembly disposed below the planet in an axially aligned relationship with, but axially displaced from, the planet, an alignment assembly disposed above the planet in an axially aligned relationship with, but axially displaced from, the planet, means operatively coupled to the alignment assembly for moving the alignment assembly axially into coupled relationship with the planet, means operatively coupled to the alignment assembly for rotating the alignment assembly on the particular axis to a particular position, means operatively coupled to the alignment assembly for moving the alignment assembly axially out of coupled relationship with the planet, substrate-moving means disposed relative to the alignment assembly for moving the substrate to a position in aligned relationship with the planet, means operatively coupled to the lifter assembly for moving the lifter assembly axially upwardly to receive the substrate from the alignment assembly after the movement of the substrate into alignment with the planet, means for withdrawing the substrate-moving means from alignment with the alignment assembly and the planet after the receipt of the substrate by the lifter assembly, means operatively coupled to the lifter assembly for moving the lifter assembly axially downwardly to deposit the substrate on the planet, and means for providing a deposition on the substrate after the deposit of the substrate on the planet.

2. Apparatus as set forth in claim 1 wherein the alignment assembly and the lifter assembly are pneumatic.

3. Apparatus as set forth in claim 1, comprising, the substrate having a working area for receiving the deposition, means on the lifter assembly for receiving the substrate at positions outside of the working area of the substrate, and means on the planet for receiving the substrate at positions outside of the working area of the substrate.

4. Apparatus as set forth in claim 1, wherein said deposition means comprises, a gun disposed relative to the planet for producing said deposition on the substrate after the disposition of the substrate on the planet, and means disposed relative to the planet for rotating the planet on the particular axis during the operation of the gun in producing the deposition on the substrate.

5. Apparatus as set forth in claim 4, comprising, the alignment assembly and the lifter assembly being pneumatic, the substrate having a working area for receiving the deposition, and means on the planet assembly for receiving the substrate at positions outside of the working area of the substrate.

6. Apparatus for providing a controlled deposition on a substrate, comprising, a planet disposed in a particular plane and rotatable on a particular axis substantially perpendicular to the particular plane, means operatively coupled to the planet for rotating the planet on the particular axis to a particular position relative to the substrate and for then withdrawing from the planet, substrate-moving means disposed relative to the planet for moving the substrate to a position displaced on the particular axis from the planet after the rotation of the planet on the particular axis to the particular position, means disposed relative to the planet for transferring the substrate from the substrate-moving means to the planet and for then withdrawing from the planet, and means for providing a deposition on the substrate after the transfer of the substrate to the planet and the withdrawal of the transferring means from the planet.

7. Apparatus as set forth in claim 6, comprising, the substrate-moving means being operative to become withdrawn from the substrate after the transfer of the substrate from the substrate-moving means.

8. Apparatus as set forth in claim 6, wherein said deposition means comprises, a gun disposed relative to the particular axis for producing said deposition on the substrate when the substrate is disposed on the planet, and means disposed relative to the planet for rotating the planet on the particular axis during the operation of the gun in producing the deposition on the substrate.

9. Apparatus as set forth in claim 6, comprising, a cassette chamber for holding the substrate, and means disposed in co-operative relationship with the substrate-moving means and disposed relative to the cassette chamber for providing for the transfer of the substrate from the cassette chamber to a position for the movement of the substrate by the substrate-moving means to the position displaced on the particular axis from the planet.

10. Apparatus as set forth in claim 8, comprising, the substrate-moving means being operative to become withdrawn from the substrate after the transfer of the substrate from the substrate-moving means, a cassette chamber for holding the cassette, and means disposed in co-operative relationship with the substrate-moving means and disposed relative to the cassette chamber for providing for the transfer of the substrate from the cassette chamber to a position for the movement of the substrate by the substrate-moving means to the position displaced on the particular axis from the planet.

11. Apparatus for providing a controlled deposition on a substrate, comprising, a planet disposed in a particular plane and rotatable on a particular axis substantially perpendicular to the particular plane, an alignment assembly disposed above the planet in an axially aligned relationship, but axially displaced from, the particular axis of the planet, moving means operatively coupled to the alignment assembly for moving the alignment assembly along the particular axis to a position in coupled relationship to the planet, and means operatively coupled to the alignment assembly for rotating the alignment assembly on the particular axis to move the planet to a particular position for the transfer of the substrate to the planet, disposing means positioned relative to the planet for disposing the substrate on the planet after the rotation of the planet to the particular position, and means for providing a deposition on the substrate after the disposition of the substrate on the planet.

12. Apparatus as recited in claim 11, comprising, means operatively coupled to the alignment assembly for obtaining a withdrawal of the alignment assembly by the moving means from the planet after the rotation of the alignment assembly to move the planet to the particular rotary position and before the disposition of the substrate on the planet.

13. Apparatus as recited in claim 11, wherein said deposition means comprises, a gun for providing a controlled deposition on the substrate, and means operatively coupled to the planet for producing a rotation of the planet on the particular axis during the operation of the gun in producing the controlled deposition on the substrate.

14. Apparatus as recited in claim 11, comprising, means disposed relative to the planet for moving the substrate to the particular axis after the rotation of the alignment assembly on the particular axis and before the disposition of the substrate on the planet.

15. Apparatus as set forth in claim 13, comprising, the disposing means being operative to rotate the substrate through an angle of substantially 90° on the particular axis relative to the planet, without the operation of the gun, after the controlled deposition of a layer on the substrate for a particular period of time, and the gun being operative to produce the controlled deposition on the substrate after the rotation of the substrate through the angle of substantially 90° relative to the planet without the operation of the gun.

16. Apparatus as set forth in claim 15, comprising, means operatively coupled to the alignment assembly for obtaining a withdrawal of the alignment assembly from the planet after the rotation of the alignment assembly and before the disposition of the substrate on the planet, and means disposed relative to the substrate for moving the substrate to the particular axis after the rotation of the alignment assembly on the particular axis and before the disposition of the substrate on the planet.

17. Apparatus for providing a controlled deposition on a substrate, comprising, a planet disposed in a particular plane and rotatable on a particular axis substantially perpendicular to the particular plane, means operatively coupled to the planet for rotating the planet on the particular axis to a particular position, a lifter assembly disposed on the particular axis in axially displaced relationship to the planet, substrate-moving means disposed relative to the substrate and the planet for moving the substrate to the particular axis in axially displaced relationship to the planet, movable means in the lifter assembly for moving the lifter assembly along the particular axis to a position for receiving the substrate after the movement of the substrate to the particular axis in the axially displaced relationship to the planet and for then transferring the substrate on the particular axis to the planet, and means for providing a deposition on the substrate after the transfer of the substrate to the planet.

18. Apparatus as set forth in claim 17, wherein said deposition means comprises, a gun disposed relative to the particular axis for providing a controlled deposition on the substrate with the substrate on the planet, and means operatively coupled to the planet for rotating the planet on the particular axis while the gun is producing the controlled deposition on the substrate.

19. Apparatus as set forth in claim 17, comprising, the substrate being movable by the substrate-moving means to a position withdrawn from the particular axis of the planet after the reception of the substrate by the movable means, and the lifter assembly being movable along the particular axis to a position withdrawn from the planet after the transfer of the substrate to the planet.

20. Apparatus as set forth in claim 17, comprising, the substrate-moving means being moved in a direction transverse to the particular axis to a position withdrawn from the particular axis of the planet after the reception of the substrate by the movable means in the lifter assembly, and the movable means in the lifter assembly being movable along the particular axis to a position raising the substrate from the substrate-moving means and, after the withdrawal of the substrate-moving means in the transverse direction from the particular axis of the planet, being movable along the particular axis to a position transferring the substrate to the planet and thereafter being movable along the particular axis to a position withdrawn from the planet.

21. Apparatus as set forth in claim 20, wherein said deposition means comprises, a gun disposed relative to the particular axis for providing a controlled deposition on the substrate with the substrate on the planet, and planet-rotating means operatively coupled to the planet for rotating the planet on the particular axis while the gun is producing the controlled deposition on the substrate.

22. Apparatus as set forth in claim 18, comprising, the movable means in the lifter assembly being operative to rotate the substrate through an angle of substantially 90° relative to the planet after the controlled deposition by the gun on the substrate, the gun being inoperative during the rotation of the substrate through the angle of substantially 90° relative to the planet and being operative again after the rotation of the substrate through the angle of substantially 90° relative to the planet to provide the controlled deposition on the substrate, the planet-rotating means being operative to rotate the planet during the operation of the gun in producing the controlled deposition on the substrate after the rotation of the substrate through the angle of substantially 90° relative to the planet.

23. Apparatus as set forth in claim 22, comprising, the substrate-moving means being operative to move in a direction transverse to the particular axis to a position withdrawn from the particular axis of the planet after the reception of the substrate by the movable means, and the movable means being movable along the particular axis to a position raising the substrate from the lifter assembly and, after the withdrawal of the substrate in the transverse direction from the particular axis of the planet, being movable on the particular axis to a position transferring the substrate to the planet and thereafter being movable on the particular axis to a position withdrawn from the planet.

24. Apparatus for providing a controlled deposition on a substrate, comprising, a planet rotatable on a first particular axis and constructed to receive the substrate, means operatively coupled to the planet for producing a rotation of the planet on a second particular axis different from the first particular axis to dispose the planet for receiving the substrate, means operatively coupled to the planet for rotating the planet on the first particular axis, after the rotation of the planet on the second particular axis, to align the planet for receiving the substrate, means operatively coupled to the planet and rotatable on the second particular axis for rotating the planet on the second particular axis, after the reception of the substrate on the planet, to obtain the controlled deposition on the substrate, and deposition means disposed relative to the planet for providing a controlled deposition on the substrate during the rotation of such substrate on the second particular axis after the reception of such substrate on the planet.

25. Apparatus as set forth in claim 24, comprising, the deposition means including a gun disposed relative to the first particular axis for producing the controlled deposition on the substrate, and means operatively coupled to the gun for obtaining an operation of the gun when the substrate is disposed on the planet and is rotating on the first particular axis.

26. Apparatus as set forth in claim 24, comprising, substrate-moving means disposed relative to the substrate for moving the substrate to the first particular axis at a position displaced along the first particular axis from the planet, after the disposition of the planet to receive the substrate, to provide for the reception of the substrate on the planet.

27. Apparatus as set forth in claim 26, comprising, means disposed relative to the substrate and the substrate-moving means for separating the substrate from the substrate-moving means after the movement of the substrate to the first particular axis and for thereafter moving the substrate along the first particular axis to the position for the reception of the substrate on the planet, the substrate-moving means being operative to be withdrawn from the position providing for the disposition of the substrate on the first particular axis after the separation of the substrate from the substrate-moving means and before the reception of the substrate on the planet.

28. Apparatus as set forth in claim 24, the substrate having a working area for receiving the controlled deposition and having a peripheral border outside of the working area, the planet being constructed to receive the substrate in the peripheral border outside of the working area of the substrate.

29. Apparatus as set forth in claim 27, comprising, the deposition means including a gun disposed relative to the first particular axis for producing the controlled deposition on the substrate, and means operatively coupled to the gun for obtaining an operation of the gun when the substrate is disposed on the planet and is rotating on the first particular axis, the substrate having a working area for receiving the controlled deposition and having a peripheral border outside of the working area, the planet being constructed to receive the substrate in the peripheral border outside of the working area of the substrate.

30. Apparatus for providing a controlled deposition on a substrate, comprising, a planet disposed in a particular plane and rotatable on a particular axis substantially perpendicular to the particular plane, a lifter assembly disposed on the particular axis and movable along the particular axis and constructed to receive and hold the substrate, the substrate being disposed on the particular axis in displaced relationship to the planet, lifter assembly moving means operatively coupled to the lifter assembly for providing a movement of the lifter assembly in a first direction along the particular axis to receive the substrate and for then moving the lifter assembly along the particular axis in a second direction opposite to the first direction to deposit the substrate on the planet, and means for providing a deposition on the substrate after the deposit of the substrate on the planet.

31. Apparatus as set forth in claim 30, comprising, the lifter assembly moving means being operative to move the lifter assembly in the second direction along the particular axis to withdraw the lifter assembly from the planet after the deposit of the substrate on the planet, the deposition means including a gun disposed relative to the particular axis for producing a controlled deposition on the substrate, and planet-rotating means operatively coupled to the planet for rotating the planet on the particular axis during the operation of the gun in producing the controlled deposition on the substrate.

32. Apparatus as set forth in claim 31, comprising, the controlled deposition constituting a first controlled deposition, means for providing for a movement of the lifter assembly by the lifter assembly moving means in the first direction along the particular axis to displace the substrate from the planet, means operatively coupled to the planet for providing a rotation of the substrate through an angle of substantially 90° relative to the planet with the substrate displaced from the planet, means operatively coupled to the lifter assembly-moving means for providing a movement of the lifter assembly in the second direction along the particular axis to deposit the substrate on the planet, the gun being operative after the displacement of the substrate through the angle of substantially 90° relative to the planet and the deposit of the substrate on the planet to produce a second controlled deposition on the substrate, the planet-rotating means being operative to rotate the planet on the particular axis during the operation of the gun in producing the second controlled deposition on the substrate.

33. Apparatus as set forth in claim 31, comprising, the gun including means for producing a magnetic field through the substrate in a direction substantially parallel to the particular axis, and the gun including means for producing charged particles for movement in the magnetic field.

* * * * *